(12) United States Patent
Yamamoto et al.

(10) Patent No.: US 6,891,785 B2
(45) Date of Patent: May 10, 2005

(54) OPTICAL DISC REPRODUCTION APPARATUS

(75) Inventors: Takeharu Yamamoto, Osaka (JP);
Takashi Kishimoto, Nara (JP);
Yoshihiro Kanda, Osaka (JP);
Hiroyuki Yamaguchi, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 362 days.

(21) Appl. No.: 10/153,215

(22) Filed: May 21, 2002

(65) Prior Publication Data

US 2002/0176340 A1 Nov. 28, 2002

(30) Foreign Application Priority Data

May 28, 2001 (JP) ........................................ 2001-158705

(51) Int. Cl.[7] ................................................ G11B 7/00
(52) U.S. Cl. ................................ 369/47.28; 369/59.19; 369/59.2
(58) Field of Search .......................... 369/47.1, 47.15, 369/47.28, 47.48, 53.1, 59.1, 59.2, 59.19, 53.15

(56) References Cited

U.S. PATENT DOCUMENTS 5,155,722 A * 10/1992 Yoshida ................... 369/47.52
5,892,740 A * 4/1999 Nagasawa et al. ......... 369/44.26
6,044,051 A   3/2000 Miyagawa et al.
6,657,929 B1 * 12/2003 Minamino et al. ......... 369/44.13

FOREIGN PATENT DOCUMENTS

CN       1167972 A      12/1997

OTHER PUBLICATIONS

Chinese Office Action for corresponding Application 02121726.2, dated Apr. 6, 2004.

* cited by examiner

Primary Examiner—Muhammad Edun
(74) Attorney, Agent, or Firm—Renner, Otto, Boisselle & Sklar, LLP

(57) ABSTRACT

An optical disc reproduction apparatus includes a sector detection section for detecting a sector; a sector reproduction time measuring section for measuring a reproduction time of the sector, and outputting sector reproduction time data which represents the measured reproduction time of the sector; an unrecorded portion detection section for detecting an unrecorded portion which is a portion of the sector in which no data is recorded; an unrecorded portion time measuring section for measuring a reproduction time of the unrecorded portion, and outputting unrecorded portion time data which represents the measured reproduction time of the unrecorded portion; and a sector determination section for determining whether the sector is an unrecorded sector or not, based on a relationship between the sector reproduction time data and the unrecorded portion time data, the unrecorded sector being a sector which is in an unrecorded state.

18 Claims, 18 Drawing Sheets

(a) Address section detection signal (b) Wobble signal

OPTICAL DISC REPRODUCTION APPARATUS

BACKGROUND OF THE INVENTION

1. Field of the Invention

The present invention relates to an optical disc reproduction apparatus for an optical disc including a track having a plurality of sectors.

2. Description of the Related Art

FIG. 15 is a black diagram illustrating a structure of a conventional optical disc reproduction apparatus 1100.

The optical disc reproduction apparatus 1100 includes an address section detection section 1106, a wobble detection section 1107, a wobble PLL circuit 1105, a data PLL circuit 1112, a gate signal generation section 1113, a defect and unrecorded portion detection section 1115, an unrecorded sector determination section 1118, and a system controller 1117.

In this specification, the term "unrecorded portion" refers to a portion in an optical disc in which no data has been recorded.

The defect and unrecorded portion detection section 1115 determines whether a defect in a sector is currently being reproduced or not, and generates a defect detection signal representing a defect in the sector.

The defect and unrecorded portion detection section 1115 also determines whether an unrecorded portion of a sector is being reproduced or not, and generates an unrecorded portion detection signal representing an unrecorded sector.

FIG. 16 shows a structure of the unrecorded sector determination section 1118.

The unrecorded sector determination section 1118 includes an unrecorded portion time measuring section 2402 and a comparator 2405.

The unrecorded portion detection signal which is output from the defect and unrecorded portion detection section 1115 is input to the unrecorded portion time measuring section 2402.

The unrecorded portion time measuring section 2402 measures a reproduction time of the unrecorded portion of the sector, and outputs unrecorded portion time data which represents the measured reproduction time of the unrecorded portion of the sector.

In the comparator 2405, a reference level (unrecorded sector detection level) is preset. The comparator 2405 compares the unrecorded portion time data which is output from the unrecorded portion time measuring section 2402 with the reference level, and outputs an unrecorded sector determination signal which determines whether the sector is an unrecorded sector or not.

As described above, the optical disc reproduction apparatus 1100 determines whether the sector is an unrecorded sector or not based only on the unrecorded portion time data.

FIG. 17 shows a structure of the wobble PLL circuit 1108.

The wobble PLL circuit 1108 includes a phase comparator 1501, a switch 1502, a phase compensator 1503, a variable oscillator 1504, and a frequency divider 1505.

The phase comparator 1501 compares the phase of a wobble clock signal which has been frequency-divided by the frequency divider 1505 with the phase of a wobble signal. The phase comparator 1501 then outputs a signal representing the comparison result to the variable oscillator 1504 via the switch 1502 and the phase compensator 1503, such that the wobble clock signal is synchronized to the wobble signal.

The wobble PLL circuit 1108 (FIG. 15) receives an address section detection signal which is output from the address section detection section 1106. The address section detection signal turns the switch 1502 off, and thus the wobble PLL circuit 1108 is put on hold while the address section is being detected.

When the address section detection signal cannot be detected a prescribed number of times the system controller 1117 (FIG. 15) determines that the frequency of a data read clock signal output by the data PLL circuit 1112 is abnormal.

Thus, the optical disc reproduction apparatus 1100 makes a determination on the abnormality of the frequency of the data read clock signal based on the address section detection signal.

When an optical disc which is marketed without any data recorded in a particular data section is attempted to be reproduced and a request for reproducing an unrecorded sector is issued, it should be detected that the sector which is now being reproduced is an unrecorded sector in order to stably perform the reproduction operation.

As described above, the conventional optical disc reproduction apparatus 1100 determines whether the sector which is currently being reproduced is an unrecorded sector or not based only on the unrecorded portion time data. This system has the following problems. In the case where the reproduction speed of information recorded in a sector which is in an inner area of the optical disc is different from the reproduction speed of information recorded in a sector which is in an outer area of the optical disc (for example, in CAV reproduction), it cannot be determined whether the sector which is currently being reproduced is an unrecorded sector or not. The reason is because the unrecorded portion time relies on the reproduction speed of information.

In the case of CLV reproductions CLV control may not be accurately performed immediately after a seek operation, resulting in the reproduction speed of information varying sector by sector. In this case also, it cannot be determined whether the sector which is currently being reproduced is an unrecorded sector or not. The reason is, again, because the unrecorded portion time relies on the reproduction speed of information.

As described above, the conventional optical disc reproduction apparatus 1100 puts the wobble PLL circuit on hold only for a term during which an address section of the sector is being detected. This system has the problem that the address section cannot be accurately detected based on a wobble clock signal. The reason is that a prescribed term, during which the address is not detected, includes a term during which the wobble clock signal is disturbed. The disturbance of the wobble clock signal is caused because the address section cannot be accurately detected.

The conventional optical disc reproduction apparatus 1100 detects a frequency abnormality of the data read clock signal based only on the address section detection signal. According to such a system, the number of times when an address section detection signal is not detected needs to be counted. Therefore, the frequency abnormality of the data read clock signal cannot be detected at a high speed.

FIG. 18 explains how the wobble clock signal is disturbed. (a) shows the waveform of the address section detection signal, and (b) shows the waveform of the wobble signal.

In general, when the optical disc reproduction apparatus 1100 (FIG. 15) is operated, the timing at which the address section detection section 1106 detects the address section is delayed. As a result, the wobble PLL circuit 1108 operates for a term 2001, which disturbs the wobble clock signal. Due to a delay in response of the band pass filter of the wobble PLL circuit 1108, the wobble signal is disturbed for a term 2002. This causes the wobble clock signal to be disturbed.

SUMMARY OF THE INVENTION

According to one aspect of the invention, an optical disc reproduction apparatus includes a sector detection section for detecting a sector; a sector reproduction time measuring section for measuring a reproduction time of the sector, and outputting sector reproduction time data which represents the measured reproduction time of the sector; an unrecorded portion detection section for detecting an unrecorded portion which is a portion of the sector in which no data is recorded; an unrecorded portion time measuring section for measuring a reproduction time of the unrecorded portion, and outputting unrecorded portion time data which represents the measured reproduction time of the unrecorded portion; and a sector determination section for determining whether the sector is an unrecorded sector or not, based on a relationship between the sector reproduction time data and the unrecorded portion time data, the unrecorded sector being a sector which is in an unrecorded state.

In one embodiment of the invention, the sector determination section determines whether the sector is an unrecorded sector or not, based on a difference between the sector reproduction time data and the unrecorded portion time data.

In one embodiment of the invention, the sector determination section determines whether the sector is an unrecorded sector or not, based on a ratio between the sector reproduction time data and the unrecorded portion time data.

In one embodiment of the invention, the optical disc reproduction apparatus further includes a defect detection section for detecting a defect in the sector. The unrecorded portion time measuring section suspends measurement during a term during which the defect detection section is detecting the defect.

In one embodiment of the invention, the optical disc reproduction apparatus further includes a defect detection section for detecting a defect in the sector. The unrecorded portion time measuring section suspends outputting the unrecorded portion time data for a term during which the defect detection section is detecting the defect.

In one embodiment of the invention, the sector detection section further includes an address section detection section for detecting an address. The sector reproduction time measuring section suspends outputting the sector reproduction time data for a term during which the address section detection section is detecting the address.

In one embodiment of the invention, the optical disc reproduction apparatus is for an optical disc including a track including a plurality of sectors. The track is wobbled at a prescribed cycle. The plurality of sectors each include an address section and a data section. The optical disc reproduction apparatus further includes a wobble detection section for detecting wobbles of the track, a PLL section for outputting a clock signal synchronized to the cycle of the detected wobbles, and an address section detection section for detecting the address section based on the clock signal.

In one embodiment of the invention, the optical disc reproduction apparatus further includes a counter having a counting value which is determined based on a number of times the clock signal is output. The counter sets the counting value to a prescribed value when the counting value of the counter reaches a value corresponding to the sector reproduction time data.

According to another aspect of the invention, an optical disc reproduction apparatus for an optical disc including a track including a plurality of sectors is provided. The track is wobbled at a prescribed cycle. The plurality of sectors each include an address section and a data section. The optical disc reproduction apparatus further includes a wobble detection section for detecting wobbles of the track, a PLL section for outputting a clock signal synchronized to the cycle of the detected wobbles, an address section detection section for detecting the address section based on the clock signal, and a PLL holding section for holding the PLL section for a prescribed term including a term during which the address section is being detected.

In one embodiment of the invention, the address section detection section detects a first address section and a second address section. The PLL holding section starts holding the PLL section when a first prescribed term has passed after the first address section has been detected. The PLL holding section stops holding the PLL section when a second prescribed term has passed after the second address section has been detected.

In one embodiment of the invention, the first prescribed term does not rely on a reproduction speed of the sector.

In one embodiment of the invention, the second prescribed term does not rely on a reproduction speed of the sector.

In one embodiment of the invention, the first prescribed term is determined based on a number of times the clock signal is output.

In one embodiment of the invention, the second prescribed term is determined based on a number of times the clock signal is output.

In one embodiment of the invention, the optical disc reproduction apparatus further includes a counter having a counting value which is determined based on a number of times the clock signal is output. The second prescribed term is a term from the time when the second address section is detected to the time when the counting value of the counter reaches a prescribed value or higher.

According to still another aspect of the invention, an optical disc reproduction apparatus for an optical disc including a track including a plurality of sectors is provided. The track is wobbled at a prescribed cycle. The plurality of sectors each include an address section and a data section. The optical disc reproduction apparatus further includes a sector detection section for detecting a sector, a first PLL section for outputting a first clock signal synchronized to a cycle at which the sector is detected, a wobble detection section for detecting wobbles of the track, a second PLL section for outputting a second clock signal synchronized to a cycle of the detected wobbles, and an abnormality detection section for detecting an abnormality of a frequency of the first clock signal based on a relationship between the first clock signal which is output by the first PLL section and the second clock signal which is output by the second PLL section.

In one embodiment of the invention, the abnormality detection section detects an abnormality of the frequency of the first clock signal based on a difference between the first clock signal which is output by the first PLL section and the second clock signal which is output by the second PLL section.

In one embodiment of the invention, the abnormality detection section detects an abnormality of the frequency of the first clock signal based on a ratio between the first clock signal which is output by the first PLL section and the second clock signal which is output by the second PLL section.

Thus, the invention described herein makes possible the advantages of providing (1) an optical disc reproduction apparatus capable of determining whether the sector which is currently being reproduced is an unrecorded sector or not even in the case where the reproduction speed of information recorded in a sector in an inner area of the optical disc is different from that of information recorded in a sector in an outer area of the optical disc; (2) an optical disc reproduction apparatus capable of accurately detecting an address section based on a wobble clock signal; and (3) an optical disc reproduction apparatus capable of detecting a frequency abnormality of a data read clock signal at a high speed.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to FIGS. 1 through 14.

Figure 1A:
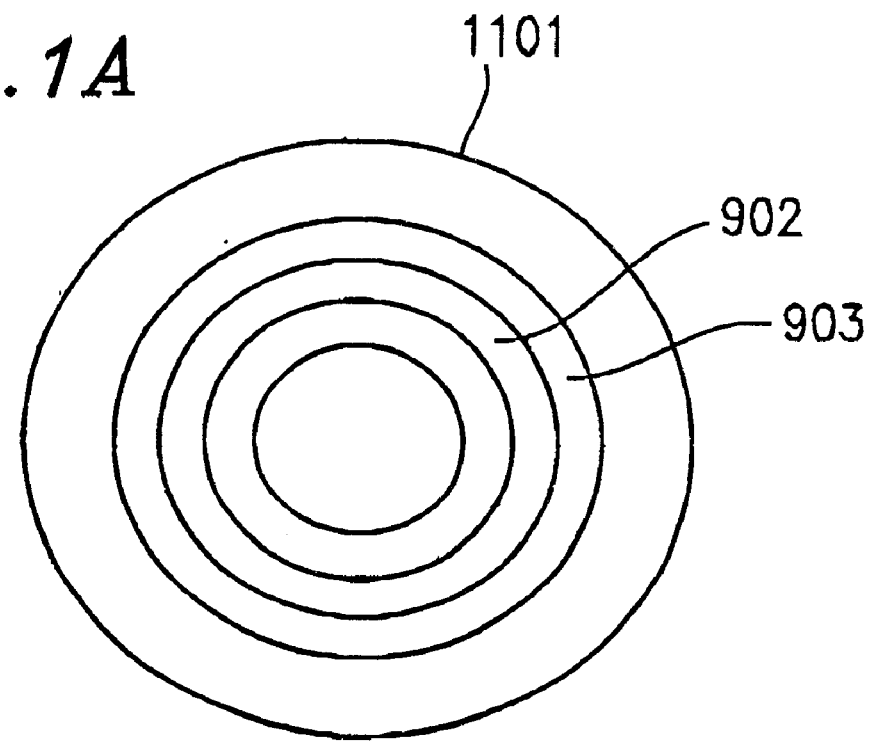
FIGS. 1A and 1B show zones and sectors of an optical disc 1101.

FIG. 1A is a schematic view of an optical disc 1101 including zones and sectors. As shown in FIG. 1A, a surface of the optical disc 1101 is divided into a plurality of zones (for example, zones 902 and 903) in a radial direction of the optical disc 1101. In each zone, portions of the track which are at the same distance from the center of the optical disc 1101 has the same recording density. In each zone, outer tracks have a lower recording density than that of inner tracks.

Figure 1B:
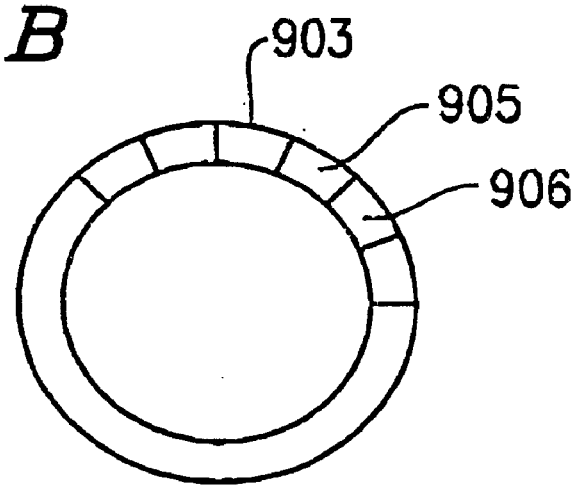

FIG. 1B shows the relationship between the zones and sectors. Each zone includes a plurality of sectors. For example, the zone 903 includes sectors 905 and 906.

Figure 2:
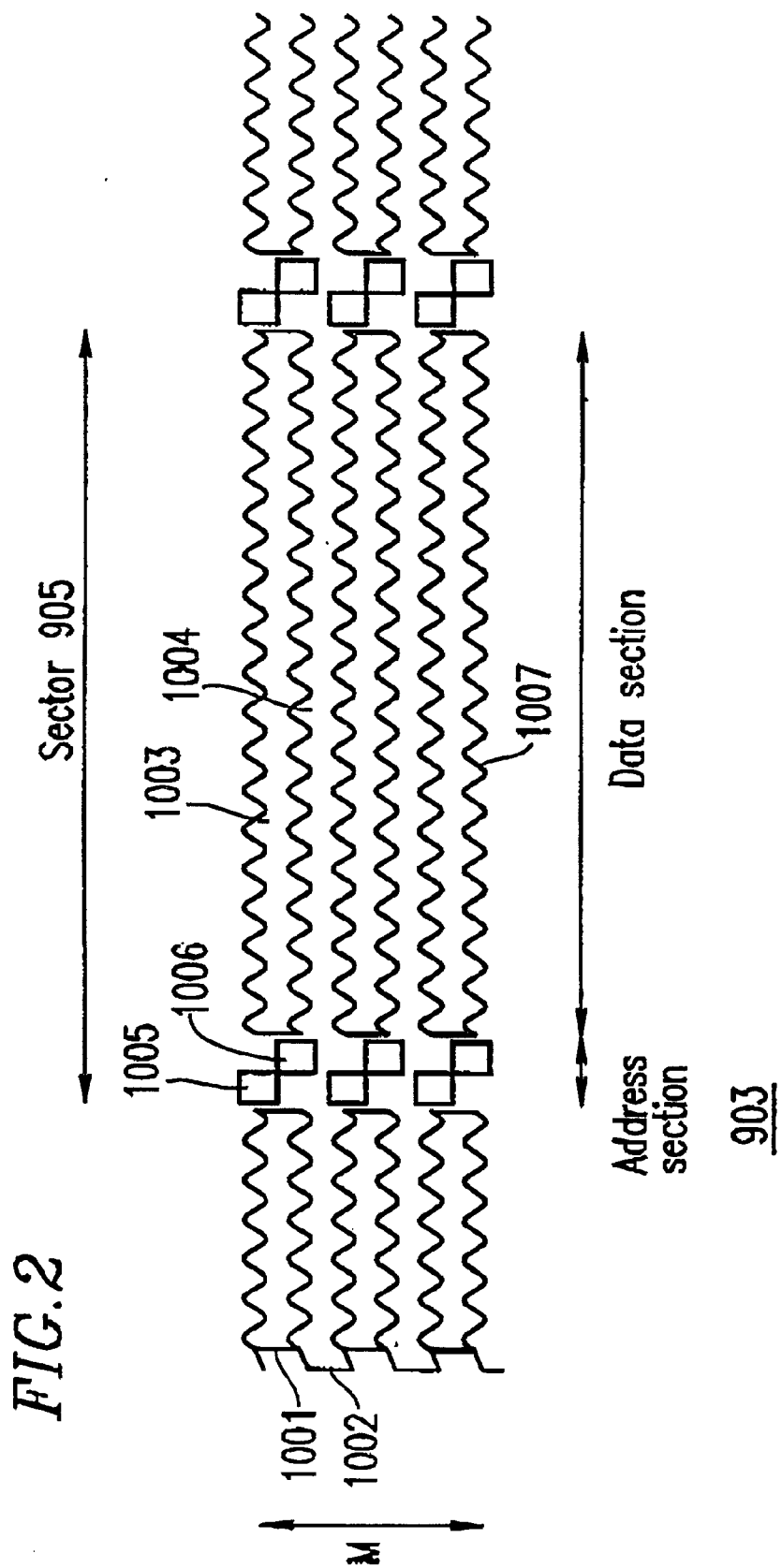
FIG. 2 shows a sector 905 of a zone 903 of the optical disc 1101.

FIG. 2 is a detailed view of the sector 905 of the zone 903. In FIG. 2, arrow M represents a radial direction of the optical disc 1101.

The zone 903 includes convexed land tracks 1001 and concaved groove tracks 1002. The sector 905 includes data sections 1003 and 1004 and address sections 1005 and 1006. The address sections 1005 and 1006 are provided in a leading area of the sector 905. Each data section 1003 is a part of the corresponding land track 1001, and each data section 1004 is a part of the corresponding groove track 1002. Each address section 1005 and each address section 1006 are shifted by half a track in the radial direction M with respect to the corresponding land track 1001 and groove track 1002, such that the address sections 1005 and 1006 can be read by both a light beam scanning the land track 1001 and a light beam scanning the groove track 1002.

The data section 1003 of the land track 1001 and the data section 1004 of the groove track 1002 are wobbled in a track direction (i.e. are wave-shaped having portions concaved and convexed in the radial direction M). The cycle of the wobbles of the data sections 1003 and 1004 is about several hundred times as high as the frequency of a data read clock signal.

Figure 3:
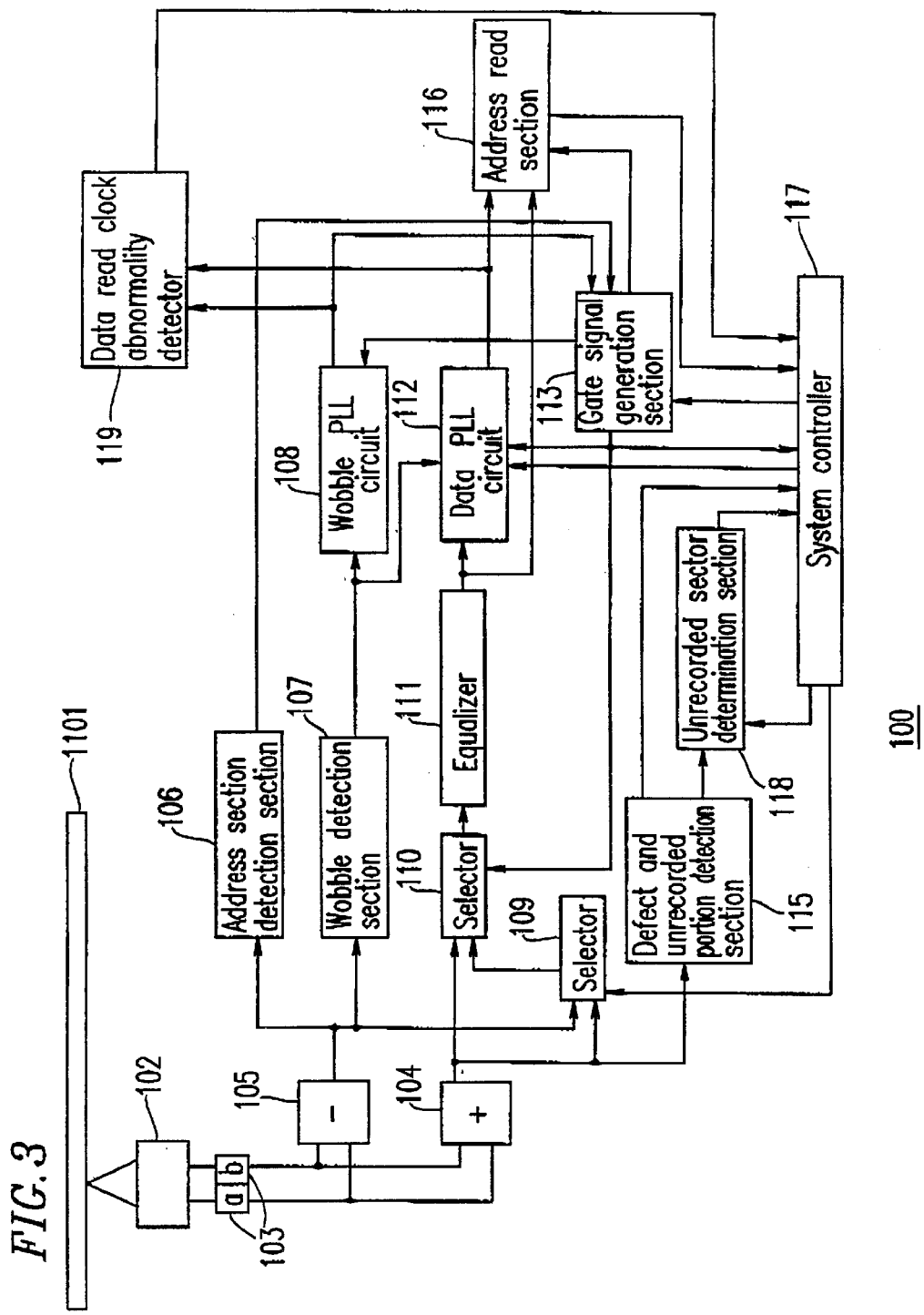
FIG. 3 is a block diagram illustrating an exemplary structure of an optical disc reproduction apparatus 100 according to the present invention.

1. Structure of an Optical Disc Reproduction Apparatus 100 According to the Present Invention FIG. 3 is a block diagram illustrating an exemplary structure of the optical disc reproduction apparatus 100 according to the present invention. The optical disc reproduction apparatus 100 is usable for reproducing information recorded on the optical disco 1101 shown in FIG. 1A.

The optical disc reproduction apparatus 100 includes a head unit 102 and a photodetector 103 attached to the head unit 102. The photodetector 103 is divided into two sections a and b along a border which is substantially parallel to a tangential line of the optical disc 1101.

The optical disc reproduction apparatus 100 further includes an adder 104, a subtractor 105, an address section detection section 106 for detecting an address section of the optical disc 1101, a wobble detection section 107 for detecting wobbles of a track of the optical disc 1101, a wobble PLL circuit 108 for outputting a clock signal synchronized to the cycle of the wobbles detected by the wobble detection section 107, a selector 109, a selector 110, an equalizer section 111, a data PLL circuit 112 for outputting a clock signal synchronized to the cycle at which the sectors of the optical disc 1101 are detected, a gate signal generation section 113, an address read section 116, a defect and unrecorded portion detection section 115, an unrecorded sector determination section 118, and a system controller 117.

The head unit 102 directs a light beam toward the optical disc 1101. The head unit 102 and a converging lens (not shown) attached to the head unit 102 are controllably positioned such that the light beam is converged to a position which is on a recording plane of the optical disc 1101 and is the center of each track of the optical disc 1101.

The light beam reflected by or transmitted through the optical disc 1101 is received by the photodetector 103, and the sections a and b of the photodetector 103 each convert an amount of light beam received into an electric signal. The electric signal is sent to the subtractor 105 and the adder 104. The selector 109 selects whether the address is detected based on a difference signal output from the subtractor 105 or a sum signal output from the adder 104 in accordance with the type of the optical disc from which data is to be reproduced. The selection is performed by a signal sent from the system controller 117.

Based on a difference signal output from the subtractor 105, the address section detection section 106 detects an address section in the track.

Figure 4:
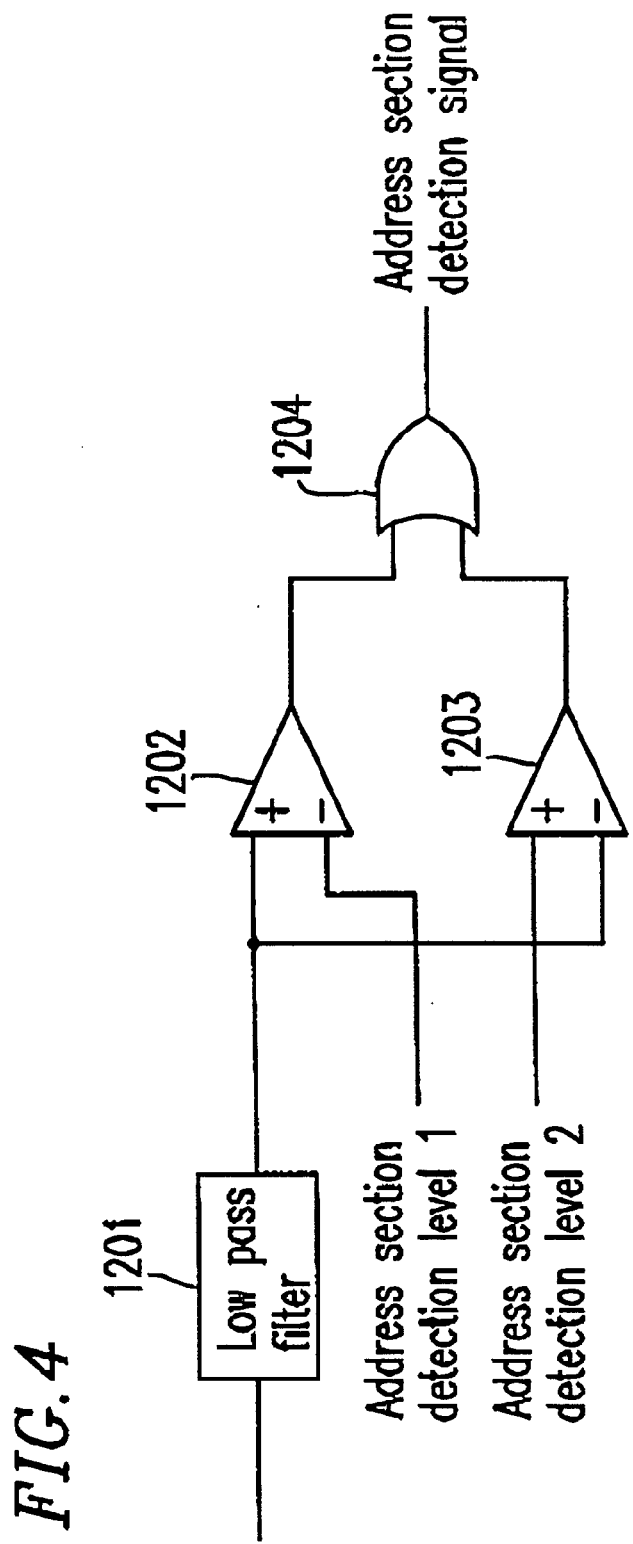
FIG. 4 shows an exemplary structure of an address section detection section 106 of the optical disc recording apparatus 100.
Figure 5:
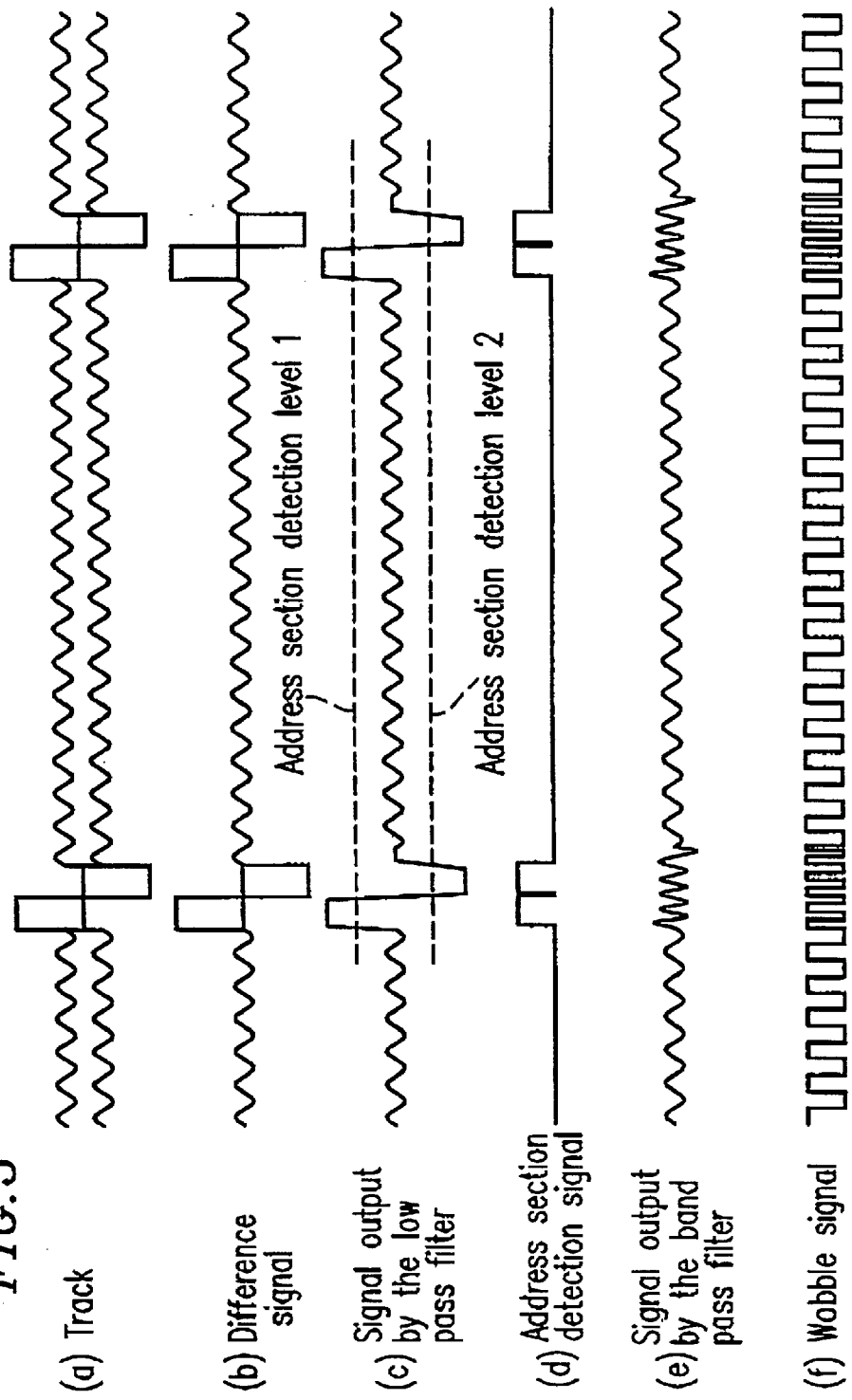
FIG. 5 is a waveform diagram illustrating exemplary waveforms of various signals obtained by processing performed by the address section detection section 106.

FIG. 4 shows an exemplary structure of the address section detection section 106. FIG. 5 is a waveform diagram illustrating exemplary waveforms of various signals obtained by processing performed by the address section detection section 106. The waveforms are shown in relation to the address sections and data sections of a sector in the optical disc 1101 ((a) of FIG. 5).

The address section detection section 106 includes a low pass filter 1201, a comparator 1202, a comparator 1203, and an OR element 1204. The address section detection section 106 operates, for example, as follows.

The low pass filter 1201 receives a difference signal as shown in (b) of FIG. 5 from the subtractor 105 (FIG. 3). The low pass filter 1201 filters out, from the difference signal, components having a frequency equal to or higher than the frequency of an RF component of the reproduction signal. As a result, the low pass filter 1201 outputs a signal as shown in (c) of FIG. 5 to the comparators 1202 and 1203. The comparator 1202 detects the signal which have a level equal to or higher than an address section detection level 1. The comparator 1203 detects the signal which have a level equal to or lower than an address section detection level 2. The OR element 1204 obtains an OR of the signals which are output from the comparators 1202 and 1203 and thus outputs an address section detection signal as shown in (d) of FIG. 5.

The address section detection section 106 can detect a sector by detecting an address section, for the following reason. One sector includes an address sector and a data sector following the address section, and detection of the address section provided at a leading position of the sector means detection of the sector. Thus, the address section detection section acts as a sector detection section for detecting a sector of the optical disc.

Returning to FIG. 3, the gate signal generation section 113 receives the address section detection signal from the address section detection section 106, and sends the address section detection signal to the selector 110 and also to the data PLL circuit 112. The selector 110 allows an output from the selector 109, which is an address reproduction signal, to pass to the equalizer section 111. The equalizer section 111 is provided for amplifying or restricting a specified frequency band of the signal and also level-slicing the signal.

Upon receiving the output from the selector 110, the equalizer 111 outputs a reproduction RF signal. The reproduction RF signal is sent to the data PLL circuit 112, and the data PLL circuit 112 outputs a data read clock signal synchronized to the reproduction RF signal. The data read clock signal is usable as a reference for signal reproduction.

The difference signal output from the subtractor 105 is also sent to the wobble detection section 107 as well as to the address section detection section 106. FIG. 5 also illustrates exemplary waveforms of signals obtained by processing performed by the wobble detection section 107.

The wobble detection section 107 includes a band pass filter (not shown). The difference signal output from the subtractor 105 is filtered by the band pass filter into a wobble detection signal having a waveform as shown in (e) of FIG. 5. The wobble detection signal is level-sliced so as to be a wobble signal as shown in (f) of FIG. 5. The wobble PLL circuit 108 performs PLL control based on the wobble signal as described below in section 3. Putting the wobble PLL circuit on hold.

Based on the outputs from the address section detection section 106 and the wobble detection section 107, the gate signal generation section 113 sends an address section gate signal, which represents the address section of the sector which is currently being reproduced, to the selector 110 such that the output from the selector 110 is selected for the address section. The gate signal generation section 113 sends a data section gate signal, which represents the data section of the sector which is currently being reproduced, to the selector 110 such that the output from the adder 104 is selected for the data section. The gate signal generation section 113 further sends an address section gate signal and a data section gate signal to the data PLL circuit 112, such that a phase comparison operation is performed in an address section when no data is reproduced and a phase comparison operation is performed in an address section and a data section when data is reproduced. The gate signal generation section 113 sends an address section gate signal to the address read section 1116. Then, the address read section 1116 reproduces an address from the data read clock signal and the reproduction RF signal.

Figure 6:
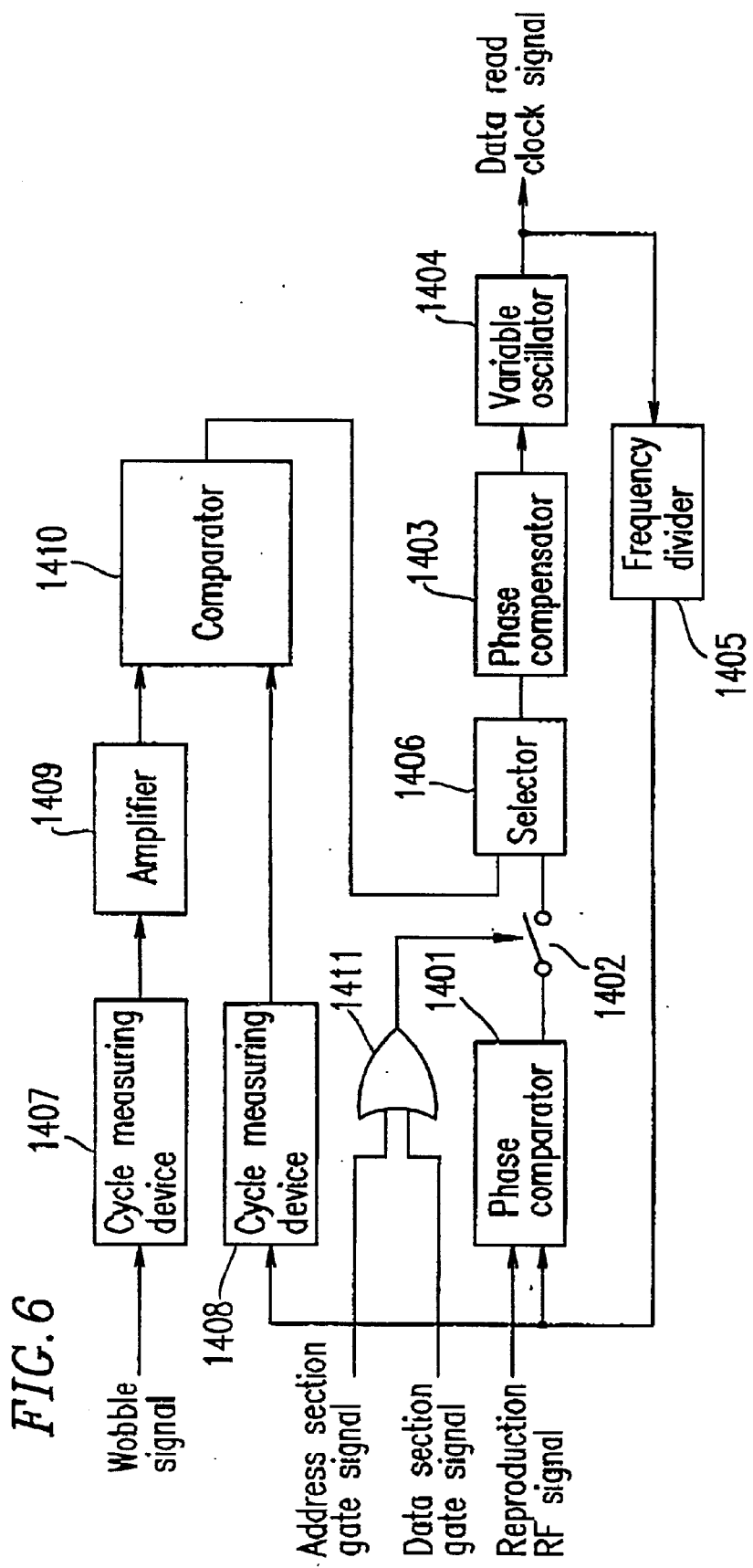
FIG. 6 shows an exemplary structure of a data PLL circuit 112 of the optical disc recording apparatus 100.

FIG. 6 shows an exemplary structure of the data PLL circuit 112 (first PLL section). The data PLL circuit 112 includes a phase comparator 1401, a switch 1402, a phase compensator 1403, a variable oscillator 1404, a frequency divider 1405, a selector 1406, a cycle measurement device 1407, a cycle measurement device 1408, an amplifier 1409, a comparator 1410, and an OR element 1411. The switch 1402 is opened or closed by a signal from the system controller 117 (FIG. 3) so as to connect the selector 1406 to the comparator 1410 or the phase comparator 1401.

The data PLL circuit 112 operates, for example, as follows.

The cycle measurement device 1407 measures the cycle of the wobble signal, and the resultant value is amplified by the amplifier 1409. The cycle of the data read clock signal is divided by the frequency divider 1405 and is measured by the cycle measurement device 1408. The value obtained by the amplifier 1409 and the value obtained by the cycle measurement device 1408 are compared with each other by the comparator 1410. The comparator 1410 then outputs a control signal. The control signal is sent to the variable oscillator 1404 via the selector 1406 and the phase compensator 1403. Thus, the cycle of the data read clock signal is controlled to be constant with respect to the cycle of the wobble signal. During this operation, the switch 1402 is opened so as to connect the selector 1406 to the comparator 1410.

During reproduction of an address or data, the switch 1402 is closed by the system controller 117. The phase of the reproduction RF signal and the phase of the data read clock signal which has been frequency-divided by the frequency divider 1405 are compared with each other by the phase comparator 1401. The output from the phase comparator 1401 is sent to the variable oscillator 1404 via the switch 1402, the selector 1406 and the phase compensator 1403. Thus, the data read clock signal is controlled to be synchronized to the reproduction RF signal.

The OR element 1411 calculates an OR of an address section gate signal, which represents the address section of the sector which is currently being reproduced, and a data section gate signal, which represents a data section in the sector which is currently being reproduced. The obtained OR is output to the switch 1402. Thus, the data PLL circuit 112 performs phase comparison between a signal obtained from the address section and a signal obtained from the data section of the sector which is currently being reproduced.

2. Determination of an Unrecorded Sector

Figure 7:
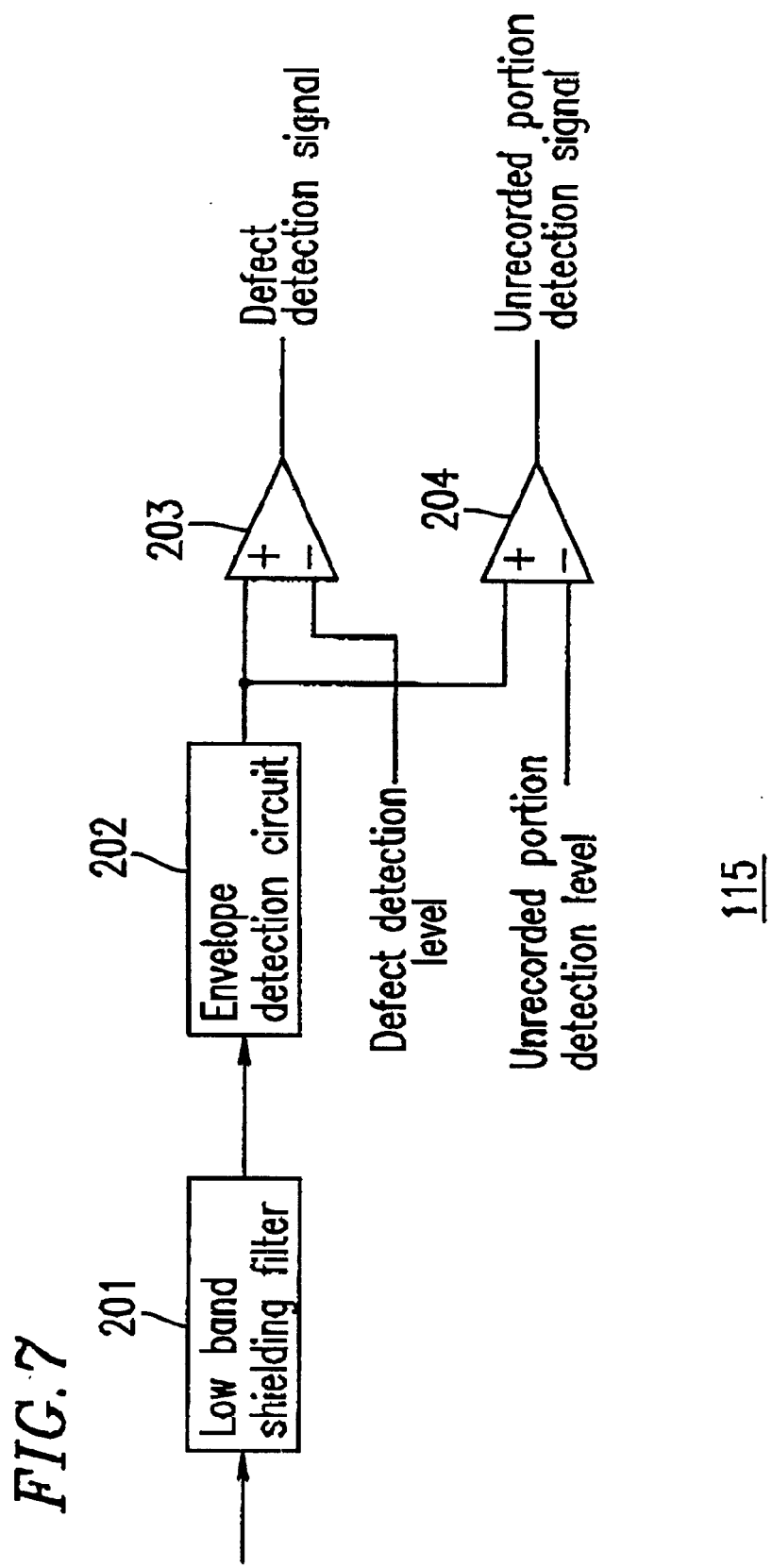
FIG. 7 shows an exemplary structure of a defect and unrecorded portion detection section 115 of the optical disc recording apparatus 100.
Figure 8:
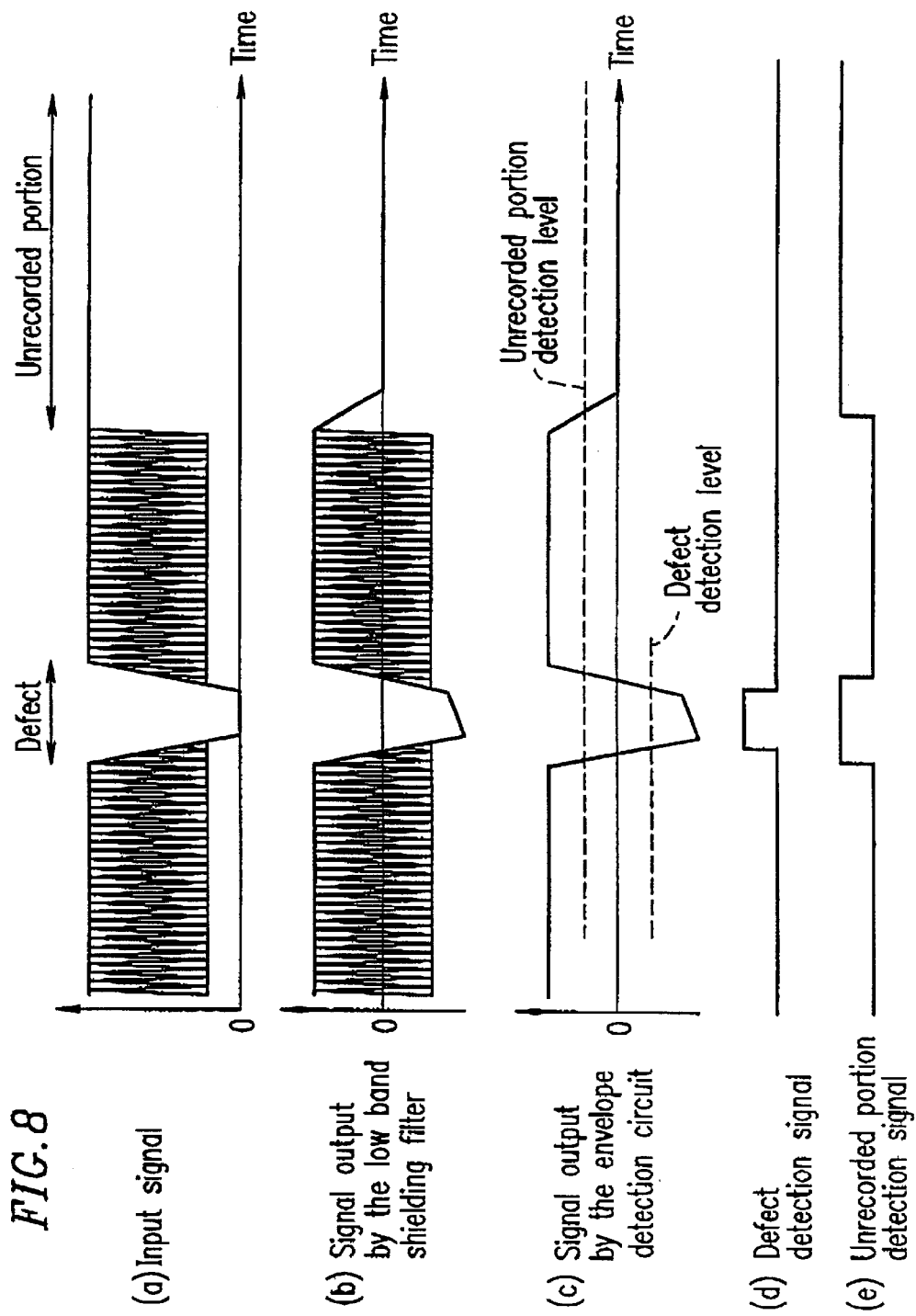
FIG. 8 is a waveform diagram illustrating exemplary waveforms of signals input to the defect and unrecorded portion detection section 115 and various signals obtained by processing performed by the defect and unrecorded portion detection section 115.

FIG. 7 shows an exemplary structure of the defeat and unrecorded portion detection section 115. FIG. 8 is a waveform diagram illustrating exemplary waveforms of signals input to the defect and unrecorded portion detection section 115 and various signals obtained by processing performed by the defect and unrecorded portion detection section 115.

The defect and unrecorded portion detection section 115 includes a low band shielding filter 201, an envelope detection circuit 202, a comparator 203, and a comparator 204.

An electric signal as shown in (a) of FIG. 8 which is output from the adder 104 (FIG. 3) is input to the low band shielding filter 201. The low band shielding filter 201 removes a DC component from the input signal, and outputs the resultant signal as shown in (b) of FIG. 8 to the envelope detection circuit 202. The envelope detection circuit 202 detects an envelope signal of the signal received from the low band shielding filter 201 as shown in (c) of FIG. 8. The envelope signal is sent to the comparators 203 and 204.

In the comparator 203, a reference level (defect detection level) to be compared with the envelope signal is preset. The comparator 203 compares the value of the envelope signal with the defect detection level. As a result, the comparator 203 generates and outputs a defect detection signal ((d) of FIG. 8), which represents a defect in the sector. In this specification, the "defect in the sector" is defined to refer to a "defect formed in the sector".

In the comparator 204, a reference level (unrecorded portion detection level) to be compared with the envelope signal is preset. The comparator 204 compares the value of the envelope signal with the unrecorded portion detection level. As a result, the comparator 204 generates and outputs an unrecorded portion detection signal ((e) of FIG. 8), which represents an unrecorded portion of the sector. In this specification, the "unrecorded portion of the sector" is defined to refer to a "portion, of the sector, in which no data has been recorded". The comparator 203 acts as a defect detection section, and the comparator 204 acts as an unrecorded portion detection section.

The defect detection signal and the unrecorded portion detection signal are sent to the system controller 117 (FIG. 3). When detecting the defect detection signal or the unrecorded portion detection signal, the system controller 117 sends a signal to the gate signal generation section 113 in order to prevent an address section gate signal or a data section gate signal from being output. Thus, while a defect or an unrecorded portion is being detected, the phase comparison operation of the data PLL circuit 112 is temporarily suspended.

The unrecorded portion detection signal generated by the defect and unrecorded portion detection section 115 is also sent to the unrecorded sector determination section 118.

Figure 9:
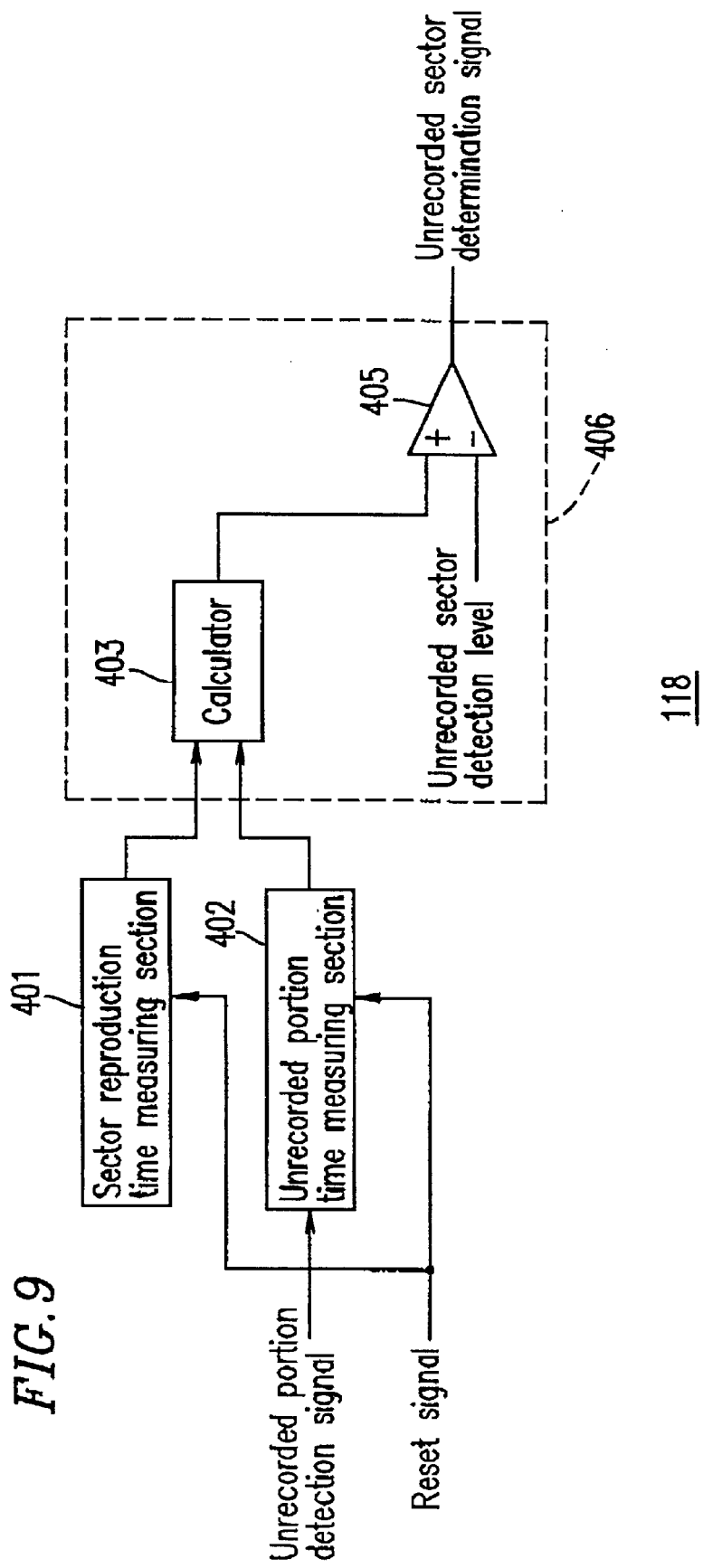
FIG. 9 shows an exemplary structure of an unrecorded sector determination section 118 of the optical disc recording apparatus 100.
Figure 10:
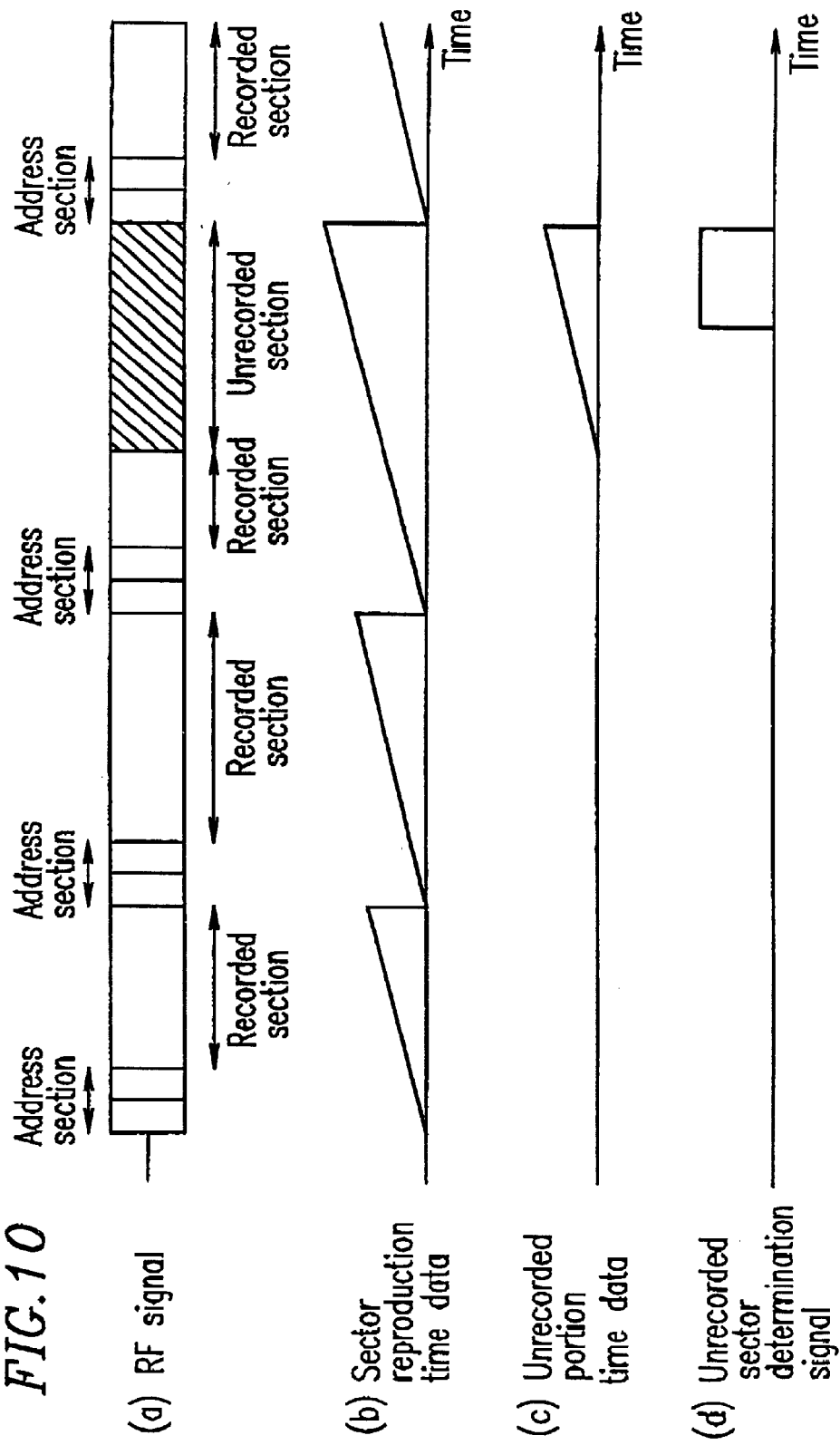
FIG. 10 is a waveform diagram illustrating exemplary waveforms of various signals obtained by processing performed by the unrecorded sector determination section 118 in comparison with a waveform of an RF signal.

FIG. 9 shows an exemplary structure of the unrecorded sector determination section 118. FIG. 10 is a waveform diagram illustrating exemplary waveforms of various signals obtained by processing performed by the unrecorded sector determination section 118 in comparison with the waveform of the RF signal ((a) of FIG. 10).

The unrecorded sector determination section 118 includes a sector reproduction time measuring section 401, an unrecorded portion time measuring section 402, a calculator 403 and a comparator 405.

The sector reproduction time measuring section 401 measures a time period in which the light beam, emitted by the head unit 102 (FIG. 3), passes through the sector which is currently being reproduced. Thus, sector reproduction time data as shown in (b) of FIG. 10 is output. The system controller 117 sends a reset signal to the sector reproduction time measuring section 401, each time an address section is detected. The value measured by the sector reproduction time measuring section 401 is cleared each time the reset signal is received.

The unrecorded portion detection signal, which is output by the defect and unrecorded portion detection section 115, is sent to the unrecorded portion time measuring section 402. The unrecorded portion time measuring section 402 measures a time period in which the unrecorded portion detection signal detects an unrecorded portion of the sector. As a result, the unrecorded portion time measuring section 402 outputs unrecorded portion time data as shown in (c) of FIG. 10. The system controller 117 sends a reset signal also to the sector reproduction time measuring section 401, each time an address section is detected.

The calculator 403 performs a calculation of the sector reproduction time data and the unrecorded portion time data. The calculator 403 may be a subtractor. In this case, the calculator 403 outputs a difference between the sector reproduction time data and the unrecorded portion time data. The calculator 403 may be a divider. In this case, the calculator 403 outputs a ratio between the sector reproduction time data and the unrecorded portion time data.

An exemplary operation of the calculator 403 will be described in more detail in the case where the calculator 403 is a divider.

The calculator 403 divides the unrecorded portion time data output from the unrecorded portion time measuring section 402 by the sector reproduction time data output from the sector reproduction time measuring section 401. The resultant value is sent to the comparator 405.

In the comparator 405, a reference level (unrecorded sector detection level) is preset. The comparator 405 compares the value of the signal sent from the calculator 403 with the unrecorded sector detection level. When the value of the signal sent from the calculator 403 is equal to or greater than the unrecorded sector detection level, the comparator 405 sends an unrecorded sector determination signal ((d) of FIG. 10) to the system controller 117. The unrecorded sector determination signal indicates that the sector which is currently being reproduced is an unrecorded sector.

Based on the unrecorded sector determination signal, the system controller 117 determines whether the sector which is currently being reproduced is an unrecorded sector or not, each time an address section is detected. Then, the system controller 117 clears the values of the data output from the sector reproduction time measuring section 401 and the unrecorded portion time measuring section 402.

The calculator 403 and the comparator 405 act together as a sector determination section 406 for determining whether the sector which is currently being reproduced is an unrecorded sector or not. In this specification, the term "unrecorded sector" is defined to refer to a sector which is in an unrecorded state.

In an optical disc reproduction apparatus according to the present invention, it is determined whether the sector which is currently being reproduced is an unrecorded sector or not based on a relationship between sector reproduction time data and unrecorded portion time data. Therefore, even when the reproduction speed of information recorded in a sector in an inner area is different from the reproduction speed of information recorded in a sector in an outer area (for example, in CAV reproduction), it can be determined whether the sector is an unrecorded sector or not. The reason is that the relationship between the sector reproduction data and the unrecorded portion time data does not rely on the reproduction speed of information recorded in a sector.

In the case of CLV reproduction, CLV control may not be accurately performed immediately after a seek operation, resulting in the reproduction speed of information varying sector by sector. Even in such a case, it can be determined whether the sector which is currently being reproduced is an unrecorded sector or not. The reason is, again, because the relationship between the sector reproduction data and the unrecorded portion time data does not rely on the reproduction speed of information recorded in a sector.

In the case where the reproduction speed does not vary (for example, CLV reproduction), it may be determined that the sector is an unrecorded sector when the difference between the sector reproduction time data and the unrecorded portion time data is equal to or less than a prescribed value.

The optical disc reproduction apparatus may be structured such that while the defect and unrecorded portion detection section 115 is detecting a defect on an optical disc, the measurement performed by the unrecorded portion time measuring section 402 or the output of the unrecorded portion time data may be temporarily suspended. In this case, the unrecorded sector determination section 118 does not incorrectly recognize the defect in the sector as an unrecorded portion. Therefore, the unrecorded sector can be more stably determined.

The optical disc reproduction apparatus may be structured such that while the defect and unrecorded portion detection section 115 is detecting an address section, the measurement performed by the sector reproduction time measuring section 401 or the output of the sector reproduction time data may be temporarily suspended. In this case, the sector reproduction time measuring section 401 does not measure the reproduction time of an address section, and only measures the reproduction time of a data section which may possibly include an unrecorded portion. Therefore, the determination precision of the unrecorded sector is further improved, and thus the unrecorded sector can be more stably determined.

3. Putting the Wobble PLL Circuit on Hold

Figure 11:
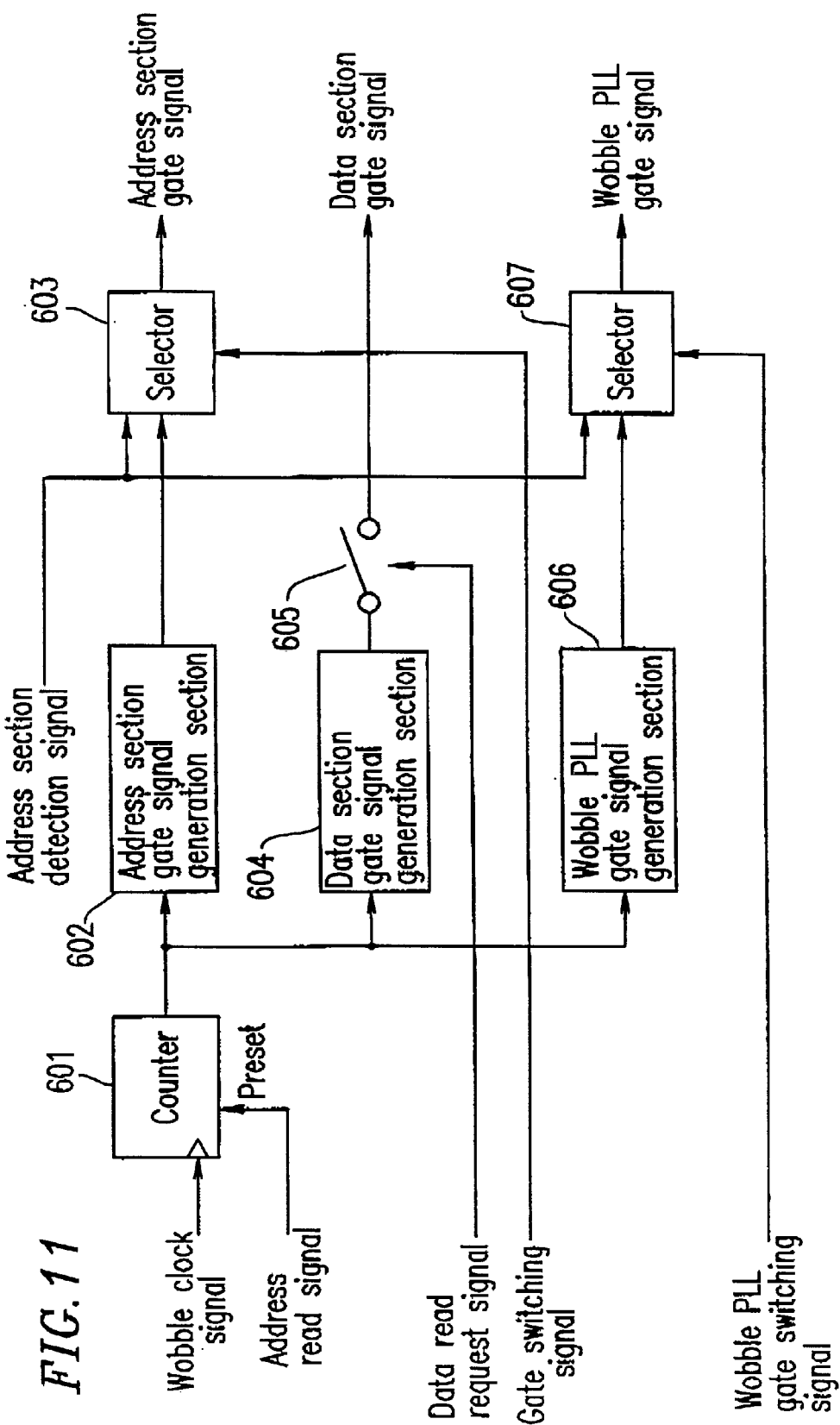
FIG. 11 shows an exemplary structure of a gate signal generation section 113 of the optical disc recording apparatus 100.
Figure 12:
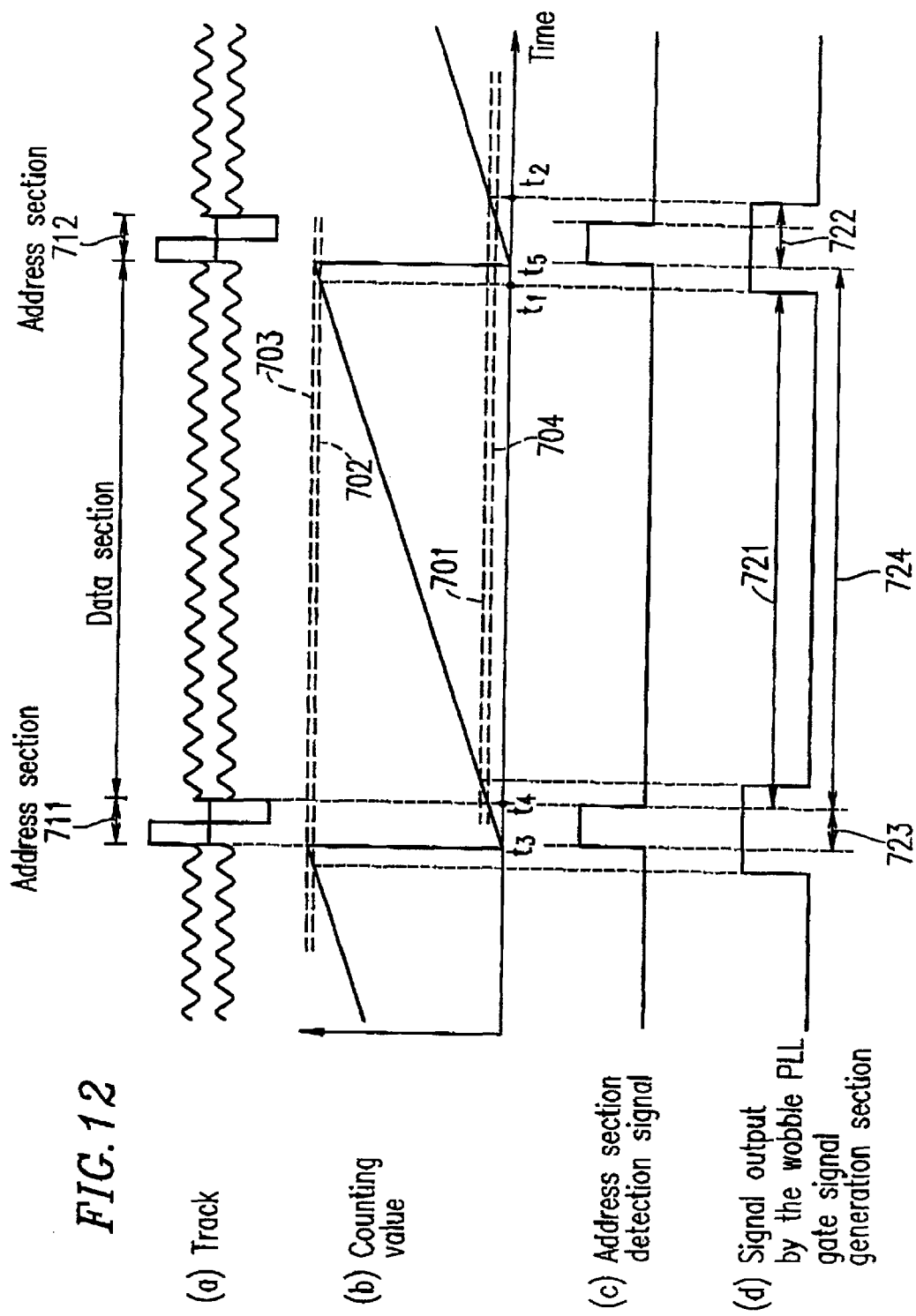
FIG. 12 is a waveform diagram illustrating exemplary waveforms of various signals obtained by processing performed by the gate signal generation section 113.

Now, with reference to FIG. 11, an exemplary structure of the gate signal generation section 113 for putting the wobble PLL circuit 108 on hold during a prescribed term including a term during which an address is being detected will be described. FIG. 12 is a waveform diagram illustrating exemplary waveforms of various signals obtained by processing performed by the gate signal generation section 113.

The gate signal generation section 113 includes a counter 601, an address section gate signal generation section 602, a selector 603, a data section gate signal generation section 604, a switch 605, a wobble PLL gate signal generation section 606, and a selector 607.

The gate signal generation section 113 operates, for example, as follows.

The counter 601 counts the wobble cloak signal output from the wobble PLL circuit 108 and determines a counting value based on the number of times the wobble clock signal is detected. When detecting an address read signal output from the system controller 117, the counter 601 resets the counting value. The counting value counted by the counter 601 is sent to the address section gate signal generation section 602, the data section gate signal generation section 604, and the wobble PLL gate signal generation section 606.

Operations of the address section gate signal generation section 602 and the data section gate signal generation section 604 will be described later with reference to FIG. 12.

An operation of the wobble PLL gate signal generation section 606 and the phrase "prescribed term including a term during which an address section is detected" used below will be described later with reference to FIG. 12.

The selector 607 selects either one of an address section detection signal or a signal output from the wobble PLL gate signal generation section 606, based on a wobble PLL gate switching signal output from the system controller 117, and outputs the selected signal as a wobble PLL gate signal.

The selector 603 selects either one of an address section detection signal or a signal output from the address section gate signal generation section 602, based on a gate switching signal output from the system controller 117, and outputs the selected signal as an address section gate signal.

While an address section is being detected, the gate signal generation section 113 outputs the address section gate signal to the selector 110 (FIG. 3).

While a data section is being detected, the gate signal generation section 113 outputs the data section gate signal to the selector 110.

The gate signal generation section 113 outputs the address section gate signal and the data section gate signal to the data PLL circuit 112 (FIG. 3). These signals are output while the address section is being detected in the case where data recorded in the data section is not reproduced, and while phase comparison is being performed between a signal obtained from the address section and a signal obtained from the data section in the case where data recorded the data section is reproduced.

When data recorded the data section is reproduced, the system controller 117 sends a data read request signal to the switch 605 so that the data section gate signal is output. The gate signal generation section 113 outputs the data section gate signal corresponding to the data section in the sector to be reproduced.

The gate signal generation section 113 also outputs the address section gate signal to the address read section 116 (FIG. 3).

As described above, FIG. 12 is a waveform diagram illustrating exemplary waveforms of various signals obtained by processing performed by the gate signal generation section 113. (a) shows address sections 711 and 712 and a data section included in the sector. (b) shows a counting value which is output from the counter 601. Each time the counter 601 receives a wobble clock signal, the counting value is increased. Upon detecting the address section detection signal, the counter 601 resets the counting value. (c)shows the address section detection signal (FIG. 11) (d) shows the signal output from the wobble PLL gate signal generation section 606.

With reference to FIG. 12, the operations of the address section gate signal generation section 602 and the data section gate signal generation section 604 will be described.

A threshold value 703 in (b) of FIG. 12 is the counting value which is obtained when the counter 601 resets its counting value (time $t_3$ or time $t_5$). A threshold value 704 in (b) of FIG. 12 is the counting value which is obtained at time $t_4$, i.e., a prescribed term (term 723) after the counter 601 resets its counting value. At time $t_5$, i.e., a prescribed term (term 724) after time $t_4$, the counter 601 resets its counting value.

The address section gate signal generation section 602 detects the term 723 between the time when the counting value of the counter 601 reaches the threshold value 703 (time $t_3$) and the time when the counting value of the counter 601 reaches the threshold value 704 (time $t_4$). The term 723 is detected based on the counting value which is output from the counter 601. The term 723 is output from the address section gate signal generation section 602 to the selector 603 as time data which represents an address section. The selector 603 outputs the received time data as the address section gate signal.

The data section gate signal generation section 604 detects the term 724 between the time when the counting value of the counter 601 reaches the threshold value 704 (time $t_4$) and the time when the counting value of the counter 601 reaches the threshold value 703 (time $t_5$). The term 724 is detected based on the counting value which is output from the counter 601. The term 724 is output from the data section gate signal generation section 604 as time data which represents a data section. The time data is output as the data section gate signal via the switch 605.

Continuously with reference to FIG. 12, the operation of the wobble PLL gate signal generation section 606 and the phrase "prescribed term including a term during which an address section is detected" will be described.

A threshold value 702 in (b) of FIG. 12 is the counting value which is obtained at time $t_1$, i.e., a prescribed term (term 721) after the address section 711 is detected. A threshold value 701 in (b) of FIG. 12 is the counting value which is obtained at time $t_2$, i.e., a prescribed term (term 722) after the address section 712 is detected. The prescribed term 722 is the term between the time when the address section 712 is detected and the time when the counting value of the counter 601 reaches the threshold value 701. The "prescribed term including a term during which an address section is detected" is, for example, the term from time $t_1$ to time $t_2$.

The wobble PLL gate signal generation section 606 detects a term between the time when the counting value of the counter 601 reaches the threshold value 702 (time $t_1$) and the time when the counting value of the counter 601 reaches the threshold value 701 (time $t_2$). The term is detected based on the counting value which is output from the counter 601. The detected term is output from the wobble PLL gate signal generation section 606 to the selector 607 as time data representing the "prescribed term including a term during which an address section is detected".

Figure 13:
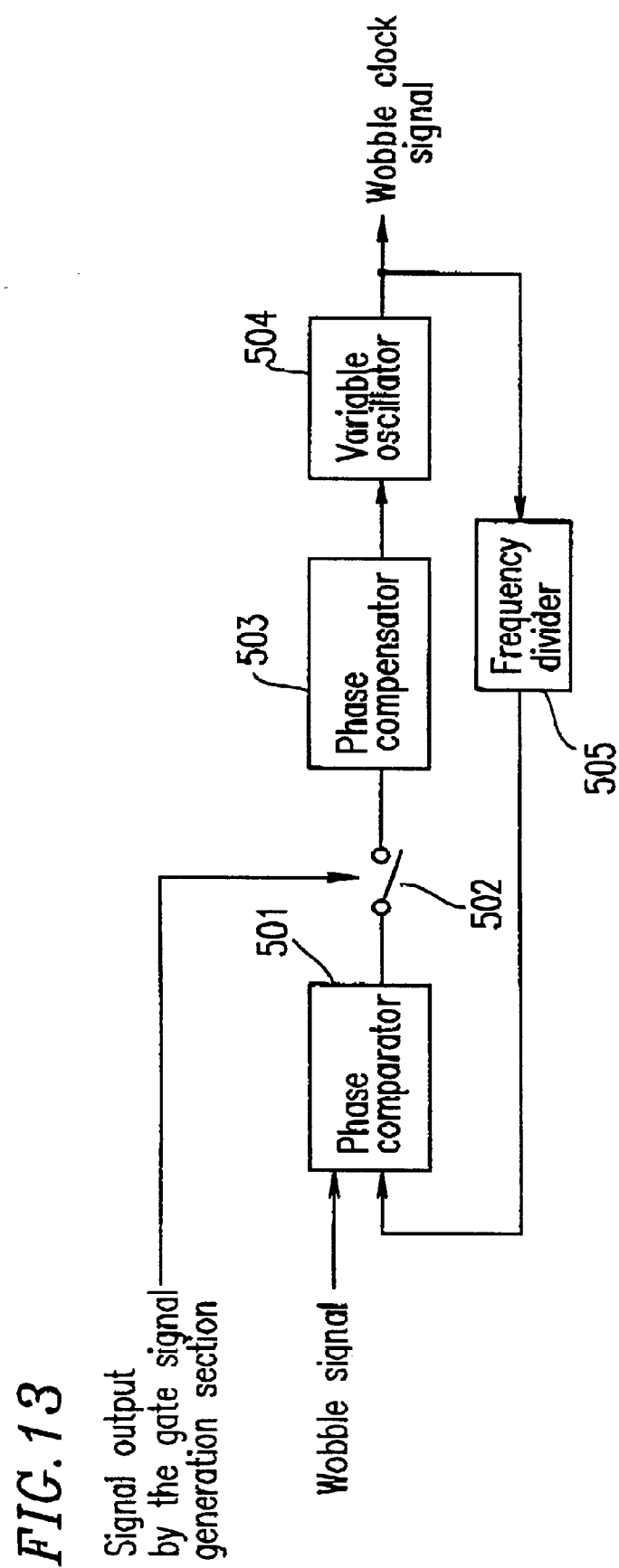
FIG. 13 shows an exemplary structure of a wobble PLL circuit 108 of the optical disc recording apparatus 100.

FIG. 13 shows an exemplary structure of the wobble PLL circuit 108 (PLL section or second PLL section). The wobble PLL circuit 108 includes a phase comparator 501, a switch 502, a phase compensator 503, a variable oscillator 504, and a frequency divider 505.

The phase comparator 501 compares the phase of the wobble clock signal which has been frequency-divided by the frequency divider 505 with the phase of the wobble signal. The output from the phase comparator 501 is sent to the variable oscillator 504 via the switch 502 and the phase compensator 503. Thus, the wobble clock signal is controlled to be synchronized to the wobble signal. The wobbles are included only in the data sections. Therefore, the wobble PLL circuit 108 is structured such that when the address section detection section 112 outputs an address section detection signal, the switch 502 is turned off in association with the detection output and thus temporarily suspends the phase comparison operation.

In an optical disc reproduction apparatus according to the present invention, a PLL section is put on hold for a prescribed term including a term during which an address section is being detected. Therefore, the address section can be accurately detected based on a clock signal. The reason is that there is no term during which the clock signal is disturbed other than the prescribed term including a term during which the address section is being detected.

An optical disc reproduction apparatus according to the present invention generates a wobble PLL gate signal based on a counting value of a counter which operates by a wobble clock signal. In the case where the reproduction speed does not vary sector by sector as in CLV reproduction, the wobble PLL gate signal may be generated based on a counting value of a counter which operates by a fixed clock signal.

An optical disc reproduction apparatus according to the present invention may use a counter which counts the frequency of the wobble signal, such that the wobble PLL gate signal is turned on when a counting value of the counter reaches a prescribed value. The frequency of the wobble signal is fixed. In this case, the wobble PLL gate signal can be generated even when the wobble clock signal is not synchronized to the wobble signal.

4. Detection of a Frequency Abnormality of a Data Read Clock Signal

The optical disc reproduction apparatus 100 may further include a data read clock signal abnormality detector 119.

The data read clock signal abnormality detector 119 detects a frequency abnormality of a data read clock signal based on a relationship between the data read clock signal and the wobble clock signal.

Figure 14:
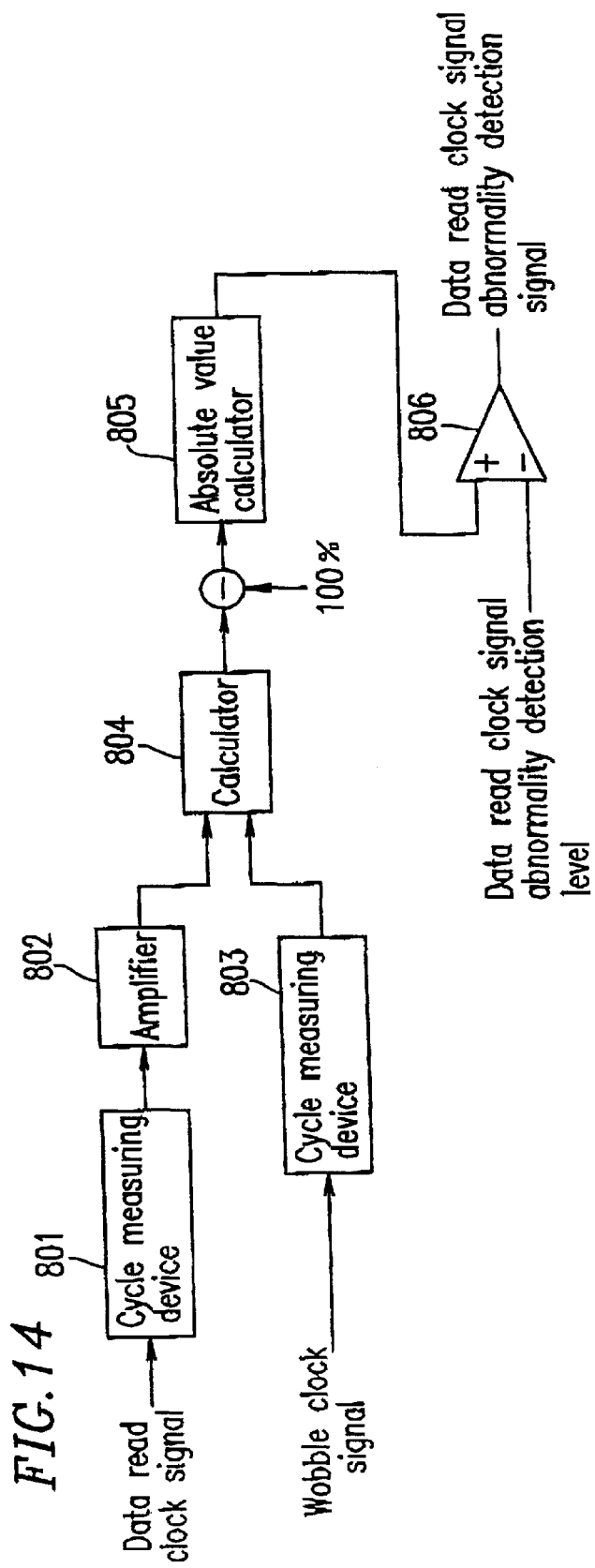
FIG. 14 shows an exemplary structure of a data read clock signal abnormality detector 119 of the optical disc recording apparatus 100.
Figure 15:
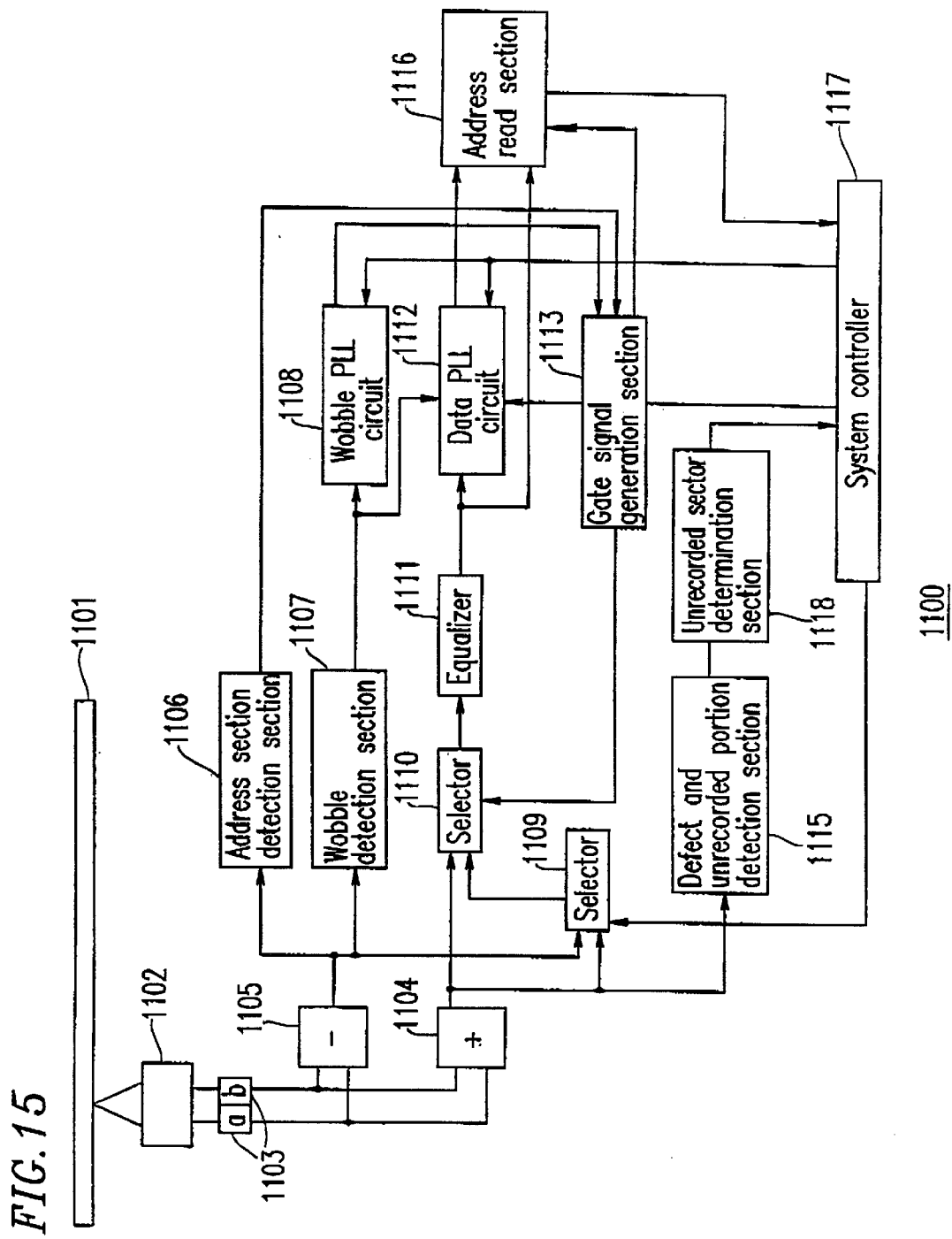
FIG. 15 is a block diagram illustrating a structure of a conventional optical disc reproduction apparatus 1100.
Figure 16:
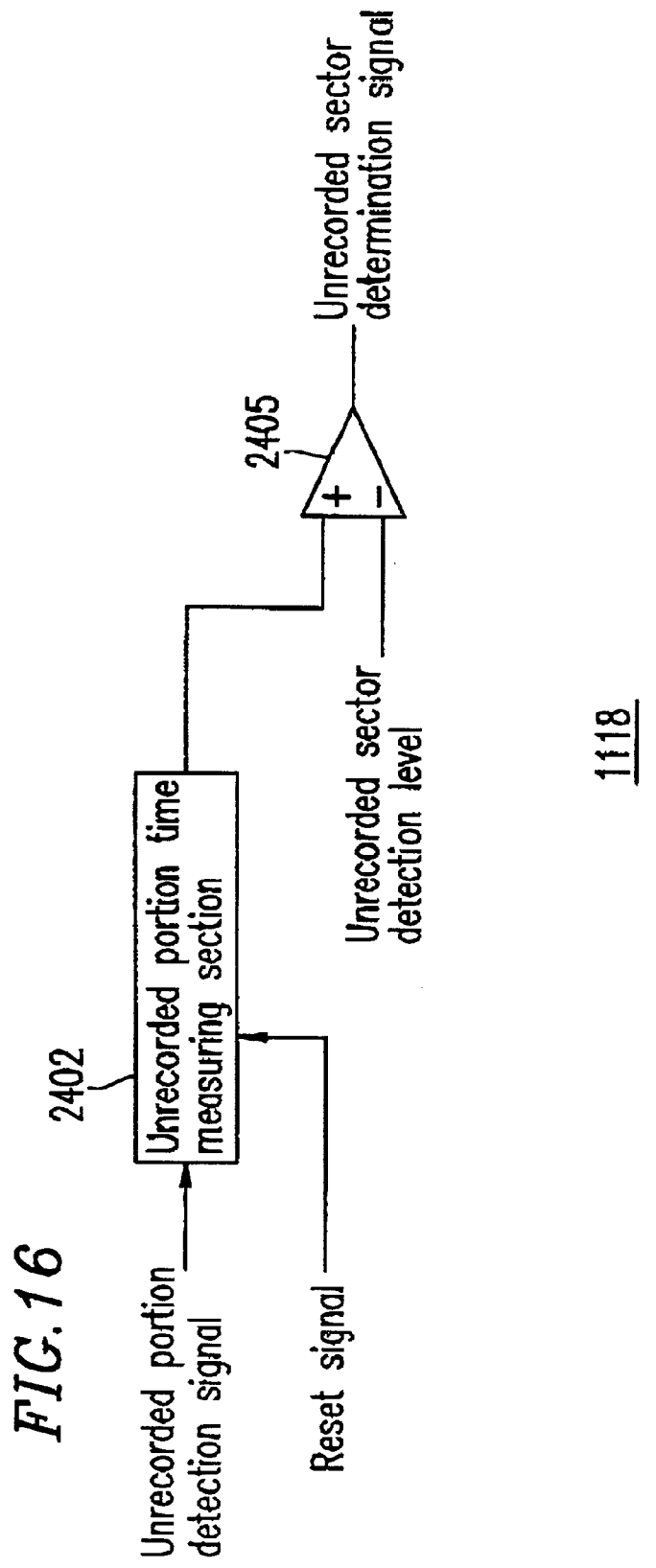
FIG. 16 shows a structure of an unrecorded sector determination section 1118 of the optical disc reproduction apparatus 1100.
Figure 17:
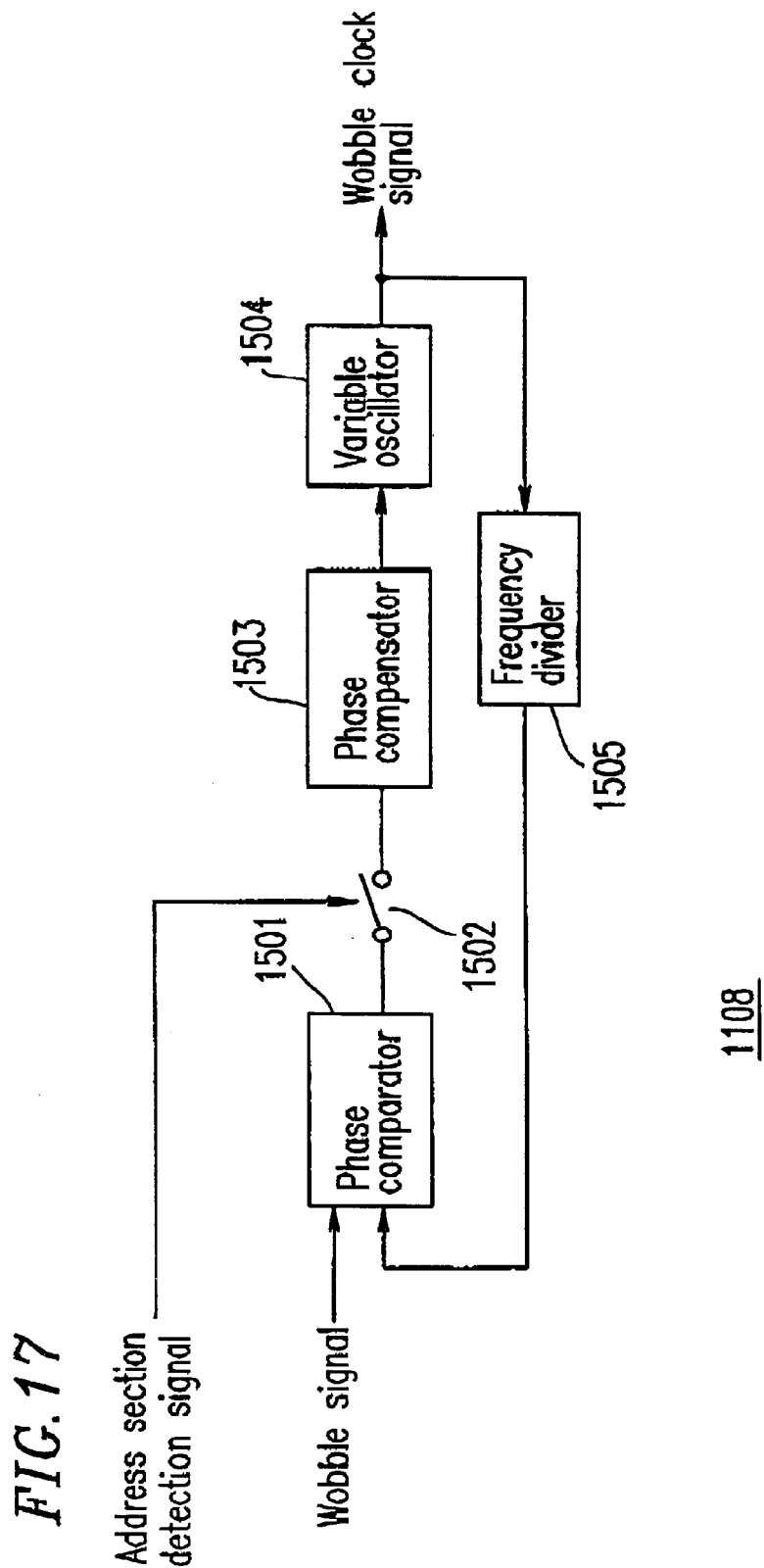
FIG. 17 shows a structure of a wobble PLL circuit 1108 of the optical disc reproduction apparatus 1100.
Figure 18:
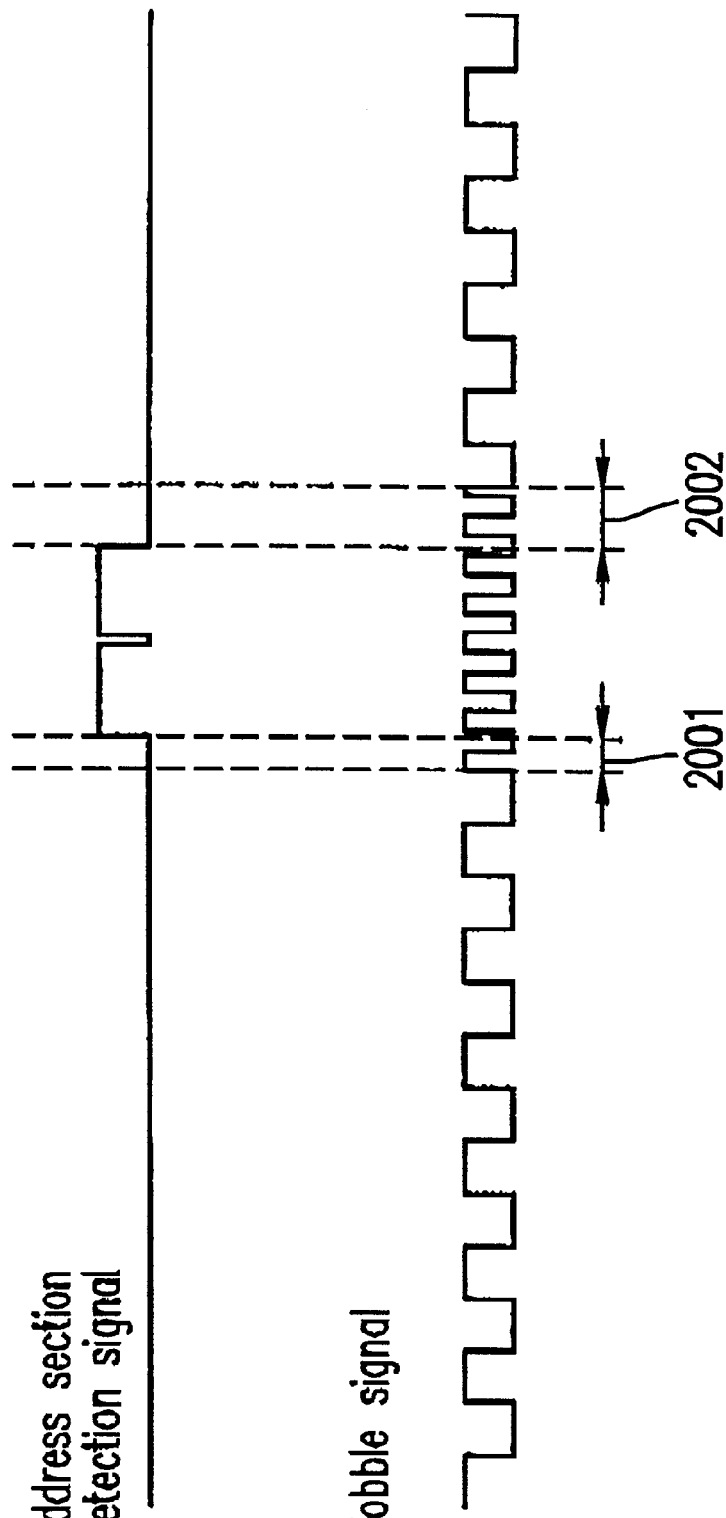
FIG. 18 explains disturbance of a wobble clock signal.

FIG. 14 shows an exemplary structure of the data read clock signal abnormality detector 119. The data read clock signal abnormality detector 119 includes a cycle measuring device 801, an amplifier 802, a cycle measuring device 803, a calculator 804, an absolute value calculator 805, and a comparator 806.

The data read clock signal abnormality detector 119 operates, for example, as follows.

The cycle measuring device 801 receives a data read clock signal from the data PLL circuit 112 (FIG. 3) and measures the cycle thereof. The amplifier 802 amplifies the measuring result provided by the cycle measuring device 801. The cycle measuring device 803 receives a wobble clock signal from the wobble PLL circuit 108 (FIG. 3) and measures the cycle thereof. The calculator 804 performs a calculation of the signal sent from the amplifier 802 and the signal sent from the cycle measuring device 803. A prescribed value is subtracted from the value obtained by the calculator 804, and the resultant value is sent to the absolute value calculator 805. The absolute value calculator 805 obtains an absolute value of the received value. The signal output from the absolute value calculator 805 represents a difference between the frequency of the wobble clock signal and the frequency of the data read clock signal. The output from the absolute value calculator 805 is sent to the comparator 806.

In the comparator 806, a reference level (data read clock signal abnormality detection level) to be compared to the signal output from the absolute value calculator 805 is preset. The comparator 806 compares the level of the signal sent from the absolute value calculator 80S with the data read clock signal abnormality detection level. As a result, the comparator 806 outputs a data read clock signal abnormality detection signal, which represents whether the frequency of the data read clock signal is abnormal or not.

When the level of the signal output from the absolute value calculator 805 is equal to or greater than the data read clock signal abnormality detection level the comparator 806 determines that the frequency of the data read clock signal is abnormal.

The data read clock signal abnormality detector 119 acts as an abnormality detection section. The data read clock signal acts as a first clock signal, and the wobble clock signal acts as a second clock signal. The abnormality detection section detects a frequency abnormality of the first clock signal based on a relationship between the first clock signal output from the first PLL section and the second clock signal output from the second PLL section.

Upon receiving the data read clock signal abnormality detection signal, the system controller 117 (FIG. 3) sends a signal to the data PLL circuit 112 (FIG. 6) such that the selector 1406 is switched to be connected so as to control the frequency of the data read clock signal to be constant with respect to the frequency of the wobble signal.

The calculator 804 may be a divider. In this case, it is detected that the frequency of the data read clock signal is abnormal based on a ratio between the cycle of the data read clock signal and the cycle of the wobble clock signal. Therefore, even in CAV reproduction in which the reproduction speed of information in an inner area of the optical disc is different from that of the information in an outer area of the optical disc, the frequency abnormality of the data read clock signal can be stably detected.

The calculator 804 may be a subtractor. In this case, it is detected that the frequency of the data read clock signal is abnormal based on a difference between the cycle of the data read clock signal and the cycle of the wobble clock signal. Therefore, even when the reproduction speed does not vary such as in CLV reproduction, the frequency abnormality of the data read clock signal can be stably detected.

An optical disc reproduction apparatus according to the present invention detects a frequency abnormality of a first clock signal based on a relationship between the first clock signal output from the first PLL section and a second clock signal output from the second PLL section. Owing to such a system, the frequency abnormality of the first clock signal can be detected at a high speed. The reason is that the relationship between the first clock signal and the second clock signal is clarified, each time the first clock signal is detected or each time the second clock signal is detected.

In an optical disc reproduction apparatus according to the present invention, it is determined whether the sector which is currently being reproduced is an unrecorded sector or not based on a relationship between sector reproduction time data and unrecorded portion time data. Therefore, even when the reproduction speed of information recorded in a sector in an inner area is different from the reproduction speed of information recorded in a sector in an outer area (for example, in CAV reproduction), it can be determined whether the sector is an unrecorded sector or not. The reason is that the relationship between the sector reproduction data and the unrecorded portion time data does not rely on the reproduction speed of information recorded in a sector.

In the case of CLV reproduction, CLV control may not be accurately performed immediately after a seek operation, resulting in the reproduction speed of information varying sector by sector. Even in such a case, it can be determined whether the sector which is currently being reproduced is an unrecorded sector or not. The reason is, again, because the relationship between the sector reproduction data and the unrecorded portion time data does not rely on the reproduction speed of information recorded in a sector.

In an optical disc reproduction apparatus according to the present invention, a PLL section is put on hold in a prescribed term including a term during which an address section is being detected. Therefore, the address section can be accurately detected based on a clock signal. The reason is that there is no term during which the clock signal is disturbed other than the prescribed term including a term during which an address section is being detected.

An optical disc reproduction apparatus according to the present invention detects a frequency abnormality of a first clock signal based on a relationship between the first clock signal output from the first PLL section and a second clock signal output from the second PLL section. Owing to such a system, the frequency abnormality of the first clock signal can be detected at a high speed. The reason is that the relationship between the first clock signal and the second clock signal is clarified each time the first clock signal is detected or each time the second clock signal is detected.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An optical disc reproduction apparatus, comprising:
   a sector detection section for detecting a sector;
   a sector reproduction time measuring section for measuring a reproduction time of the sector, and outputting sector reproduction time data which represents the measured reproduction time of the sector;
   an unrecorded portion detection section for detecting an unrecorded portion which is a portion of the sector in which no data is recorded;
   an unrecorded portion time measuring section for measuring a reproduction time of the unrecorded portion, and outputting unrecorded portion time data which represents the measured reproduction time of the unrecorded portion; and
   a sector determination section for determining whether the sector is an unrecorded sector or not, based on a relationship between the sector reproduction time data and the unrecorded portion time data, the unrecorded sector being a sector which is in an unrecorded state.

2. An optical disc reproduction apparatus according to claim 1, wherein the sector determination section determines whether the sector is an unrecorded sector or not, based on a difference between the sector reproduction time data and the unrecorded portion time data.

3. An optical disc reproduction apparatus according to claim 1, wherein the sector determination section determines whether the sector is an unrecorded sector or not, based on a ratio between the sector reproduction time data and the unrecorded portion time data.

4. An optical disc reproduction apparatus according to claim 1, further comprising a defect detection section for detecting a defect in the sector,
   wherein the unrecorded portion time measuring section suspends measurement during a term during which the defect detection section is detecting the defect.

5. An optical disc reproduction apparatus according to claim 1, further comprising a defect detection section for detecting a defect in the sector, wherein the unrecorded portion time measuring section suspends outputting the unrecorded portion time data for a term during which the defect detection section is detecting the defect.

6. An optical disc reproduction apparatus according to claim 1, wherein:
the sector detection section further includes an address section detection section for detecting an address, and
the sector reproduction time measuring section suspends outputting the sector reproduction time data for a term during which the address section detection section is detecting the address.

7. An optical disc reproduction apparatus according to claim 1, wherein:
the optical disc reproduction apparatus is for an optical disc including a track including a plurality of sectors,
the track is wobbled at a prescribed cycle,
the plurality of sectors each include an address section and a data section, and
the optical disc reproduction apparatus further includes:
a wobble detection section for detecting wobbles of the track,
a PLL section for outputting a clock signal synchronized to the cycle of the detected wobbles, and
an address section detection section for detecting the address section based on the clock signal.

8. An optical disc reproduction apparatus according to claim 7, further comprising a counter having a counting value which is determined based on a number of times the clock signal is output,
wherein the counter sets the counting value to a prescribed value when the counting value of the counter reaches a value corresponding to the sector reproduction time data.

9. An optical disc reproduction apparatus for an optical disc including a track including a plurality of sectors, wherein:
the track is wobbled at a prescribed cycle,
the plurality of sectors each include an address section and a data section, and
the optical disc reproduction apparatus further includes:
a wobble detection section for detecting wobbles of the track,
a PLL section for outputting a clock signal synchronized to the cycle of the detected wobbles,
an address section detection section for detecting the address section based on the clock signal, and
a PLL holding section for holding the PLL section for a prescribed term including a term during which the address section is being detected.

10. An optical disc reproduction apparatus according to claim 9, wherein:
the address section detection section detects a first address section and a second address section,
the PLL holding section starts holding the PLL section when a first prescribed term has passed after the first address section has been detected, and
the PLL holding section stops holding the PLL section when a second prescribed term has passed after the second address section has been detected.

11. An optical disc reproduction apparatus according to claim 10, wherein the first prescribed term does not rely on a reproduction speed of the sector.

12. An optical disc reproduction apparatus according to claim 10, wherein the second prescribed term does not rely on a reproduction speed of the sector.

13. An optical disc reproduction apparatus according to claim 10, wherein the first prescribed term is determined based on a number of times the clock signal is output.

14. An optical disc reproduction apparatus according to claim 10, wherein the second prescribed term is determined based on a number of times the clock signal is output.

15. An optical disc reproduction apparatus according to claim 10, further comprising a counter having a counting value which is determined based on a number of times the clock signal is output,
wherein the second prescribed term is a term from the time when the second address section is detected to the time when the counting value of the counter reaches a prescribed value or higher.

16. An optical disc reproduction apparatus for an optical disc including a track including a plurality of sectors, wherein:
the track is wobbled at a prescribed cycle,
the plurality of sectors each include an address section and a data section, and
the optical disc reproduction apparatus further includes:
a sector detection section for detecting a sector,
a first PLL section for outputting a first clock signal synchronized to a cycle at which the sector is detected,
a wobble detection section for detecting wobbles of the track,
a second PLL section for outputting a second clock signal synchronized to a cycle of the detected wobbles, and
an abnormality detection section for detecting an abnormality of a frequency of the first clock signal based on a relationship between the first clock signal which is output by the first PLL section and the second clock signal which is output by the second PLL section.

17. An optical disc reproduction apparatus according to claim 16, wherein the abnormality detection section detects an abnormality of the frequency of the first clock signal based on a difference between the first clock signal which is output by the first PLL section and the second clock signal which is output by the second PLL section.

18. An optical disc reproduction apparatus according to claim 16, wherein the abnormality detection sect on detects an abnormality of the frequency of the first clock signal based on a ratio between the first clock signal which is output by the first PLL section and the second clock signal which is output by the second PLL section.

* * * * *

UNITED STATES PATENT AND TRADEMARK OFFICE
CERTIFICATE OF CORRECTION

PATENT NO. : 6,891,785 B2
DATED : May 10, 2005
INVENTOR(S) : Takeharu Yamamoto et al.

It is certified that error appears in the above-identified patent and that said Letters Patent is hereby corrected as shown below:

Column 18,
Line 53, "detection sect" should read -- detection section --.

Signed and Sealed this

Twenty-fifth Day of October, 2005

JON W. DUDAS
*Director of the United States Patent and Trademark Office*